United States Patent
Seo et al.

(10) Patent No.: US 12,082,468 B2
(45) Date of Patent: *Sep. 3, 2024

(54) DISPLAY APPARATUS INCLUDING CONDUCTIVE PATTERN IN SUBSTRATE AND METHOD OF MANUFACTURING THE SAME

(71) Applicant: Samsung Display Co., Ltd., Yongin-si (KR)

(72) Inventors: Kiseong Seo, Yongin-si (KR); Jekil Ryu, Yongin-si (KR); Wonkyu Choe, Yongin-si (KR); Jungho Choi, Yongin-si (KR); Mugyeom Kim, Hwaseong-si (KR); Changyong Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/375,455

(22) Filed: Sep. 29, 2023

(65) Prior Publication Data

US 2024/0032363 A1   Jan. 25, 2024

Related U.S. Application Data

(60) Continuation of application No. 17/142,220, filed on Jan. 5, 2021, now Pat. No. 11,812,644, which is a
(Continued)

(30) Foreign Application Priority Data

Feb. 28, 2017   (KR) .................. 10-2017-0026462

(51) Int. Cl.
*H10K 59/131* (2023.01)
*H01L 27/12* (2006.01)
(Continued)

(52) U.S. Cl.
CPC ....... *H10K 59/131* (2023.02); *H01L 27/1214* (2013.01); *H10K 50/00* (2023.02);
(Continued)

(58) Field of Classification Search
CPC ...... H10K 59/131; H10K 50/00; H10K 59/12; H10K 77/111; H10K 50/14;
(Continued)

(56) References Cited

U.S. PATENT DOCUMENTS 6,201,346 B1 * 3/2001 Kusaka .................. H10K 50/87
313/506
6,849,877 B2   2/2005 Yamazaki et al.
(Continued)

FOREIGN PATENT DOCUMENTS

CN          1392615      1/2003
CN          102486906    6/2012
(Continued)

OTHER PUBLICATIONS

Extended European Search Report dated Jul. 12, 2018, in European Application No. 18158958.1.
(Continued)

*Primary Examiner* — Maliheh Malek
(74) *Attorney, Agent, or Firm* — CANTOR COLBURN LLP

(57) ABSTRACT

A display apparatus includes a display region and a peripheral region adjacent to the display region. The display apparatus further includes a first flexible substrate (FFS), a driving circuit (DC), a conductive pattern (CP), a conductive line, a light-emitting device, and a support substrate. The FFS includes a first surface and a second surface opposite the first surface. The second surface includes, in the peripheral region, a cavity extending into the FFS. The DC is on the first surface and includes at least one transistor. The CP
(Continued)

is in the cavity and is partially exposed by the cavity. The conductive line electrically connects the CP to the DC. The light-emitting device is in the display region and is electrically connected to the DC. The support substrate is on the second surface. In a view normal to the second surface, the support substrate is spaced apart from the CP.

12 Claims, 20 Drawing Sheets

Related U.S. Application Data continuation of application No. 16/783,733, filed on Feb. 6, 2020, now Pat. No. 10,916,619, which is a division of application No. 15/906,628, filed on Feb. 27, 2018, now Pat. No. 10,580,846.

(51) Int. Cl.
```
H10K 50/00        (2023.01)
H10K 50/14        (2023.01)
H10K 59/12        (2023.01)
H10K 71/80        (2023.01)
H10K 77/10        (2023.01)
H10K 102/00       (2023.01)
H10K 50/842       (2023.01)
```
(52) U.S. Cl.
CPC .......... *H10K 59/12* (2023.02); *H10K 77/111* (2023.02); *H01L 2924/12041* (2013.01); *H01L 2924/12044* (2013.01); *H10K 50/14* (2023.02); *H10K 50/8426* (2023.02); *H10K 59/1201* (2023.02); *H10K 71/80* (2023.02); *H10K 2102/311* (2023.02); *Y02E 10/549* (2013.01)

(58) Field of Classification Search
CPC .......... H10K 50/8426; H10K 59/1201; H10K 71/80; H10K 2102/311; H10K 50/844; H10K 71/00; H10K 59/124; H10K 59/1213; H10K 59/123; H10K 50/84; H10K 2102/351; H10K 59/38; H10K 50/841; H10K 50/8445; H10K 50/865; H10K 59/122; H10K 59/179; H10K 59/40; H10K 2102/00; H10K 50/805; H10K 50/87; H10K 59/126; H10K 71/50; H10K 2102/3026; H10K 50/11; H10K 50/80; H10K 50/846; H10K 59/00; H10K 59/121; H10K 59/129; H10K 71/851; H10K 77/10; H10K 19/10; H10K 30/81; H10K 30/87; H10K 50/18; H10K 50/81; H10K 50/828; H10K 50/8423; H10K 50/856; H10K 50/86; H10K 50/868; H10K 59/1216; H10K 59/127; H10K 59/128; H10K 59/1315; H10K 59/1795; H10K 59/32; H10K 59/35; H10K 59/50; H10K 59/805; H10K 59/88; H10K 59/90; H10K 65/00; H10K 71/166; H10K 71/421; H10K 10/00; H10K 19/00; H10K 30/00; H10K 39/00; H10K 77/00; H10K 85/00; H10K 99/00; H10K 2101/00; H01L 27/1214; H01L 2924/12041; H01L 2924/12044; H01L 27/1218; H01L 27/1266; H01L 27/124; H01L 51/0096–0097; H01L 51/524–525; H01L 51/5246; H01L 51/5253–5256; H01L 2251/50–568; H01L 51/50–56; H01L 51/0032–0095; Y02E 10/549; B32B 2457/206

See application file for complete search history.

(56) References Cited

U.S. PATENT DOCUMENTS

| | | | | |
|---|---|---|---|---|
| 7,271,411 | B2* | 9/2007 | Koyama | H01L 27/124 257/59 |
| 7,342,354 | B2* | 3/2008 | Utsunomiya | H10K 71/00 313/506 |
| 7,764,012 | B2* | 7/2010 | Yamazaki | H10K 50/8426 313/506 |
| 8,476,634 | B2* | 7/2013 | Jeon | H01L 27/1218 257/E33.059 |
| 8,766,271 | B2 | 7/2014 | Kim et al. | |
| 9,274,631 | B2* | 3/2016 | Anno | G02F 1/136259 |
| 9,659,966 | B2 | 4/2017 | Kwak et al. | |
| 9,735,220 | B2* | 8/2017 | Sato | G09G 3/3233 |
| 9,947,652 | B2 | 4/2018 | Choi et al. | |
| 9,991,240 | B2* | 6/2018 | Jeong | H01L 25/167 |
| 10,224,344 | B2* | 3/2019 | Lee | H01L 27/124 |
| 10,374,160 | B2* | 8/2019 | Tanaka | G09F 9/30 |
| 10,522,523 | B2* | 12/2019 | Jeong | H01L 25/0753 |
| 10,573,831 | B2* | 2/2020 | Lim | H10K 50/846 |
| 10,964,679 | B2* | 3/2021 | Jeong | H01L 25/167 |
| 11,812,644 | B2* | 11/2023 | Seo | H01L 27/1218 |
| 2003/0027369 | A1* | 2/2003 | Yamazaki | H10K 50/8426 438/21 |
| 2003/0034497 | A1* | 2/2003 | Yamazaki | H10K 71/00 257/86 |
| 2005/0023525 | A1* | 2/2005 | Ishikawa | G02F 1/1368 438/149 |
| 2006/0087224 | A1* | 4/2006 | Oki | H10K 50/8423 313/504 |
| 2008/0179594 | A1* | 7/2008 | Oh | H01L 27/1214 257/E21.414 |
| 2010/0213819 | A1* | 8/2010 | Cok | H10K 77/111 313/498 |
| 2011/0062434 | A1* | 3/2011 | Eguchi | H01L 27/12 257/E29.095 |
| 2011/0267573 | A1* | 11/2011 | Lee | H05K 9/0096 349/150 |
| 2012/0140424 | A1* | 6/2012 | Sato | G02F 1/133305 257/E29.273 |
| 2012/0206680 | A1* | 8/2012 | Onishi | G02F 1/136204 349/122 |
| 2012/0217501 | A1* | 8/2012 | Takayama | H01L 29/6675 257/E29.273 |
| 2013/0107476 | A1* | 5/2013 | Wright | H05K 1/115 361/767 |
| 2013/0299789 | A1* | 11/2013 | Yamazaki | H10K 50/8426 257/40 |
| 2014/0042406 | A1* | 2/2014 | Degner | H05K 1/028 438/34 |
| 2014/0160695 | A1* | 6/2014 | Jeong | H05K 3/361 438/26 |
| 2014/0183473 | A1* | 7/2014 | Lee | H10K 59/12 257/40 |
| 2014/0339517 | A1* | 11/2014 | Park | H10K 77/111 257/40 |
| 2014/0368761 | A1* | 12/2014 | Lin | G06F 3/041 349/12 |
| 2014/0375916 | A1* | 12/2014 | Chen | H01L 27/1218 349/33 |
| 2015/0187855 | A1* | 7/2015 | Yamazaki | H01L 27/1225 257/43 |
| 2015/0325812 | A1* | 11/2015 | Yamazaki | H10K 50/8426 257/40 |
| 2016/0043336 | A1* | 2/2016 | Kim | H10K 59/40 257/40 |
| 2016/0141531 | A1* | 5/2016 | Fukushima | H10K 10/466 257/40 |
| 2016/0190055 | A1* | 6/2016 | Jinbo | H10K 59/127 257/750 |

(56) References Cited

U.S. PATENT DOCUMENTS

| | | | |
|---|---|---|---|
| 2016/0306460 A1* | 10/2016 | Lee | H10K 59/873 |
| 2016/0307982 A1* | 10/2016 | Hatano | H10K 59/1213 |
| 2016/0329386 A1* | 11/2016 | Sauers | H10K 77/111 |
| 2017/0084860 A1* | 3/2017 | Chida | H01L 27/1266 |
| 2017/0154927 A1* | 6/2017 | Jo | H10K 50/865 |
| 2017/0168333 A1* | 6/2017 | Kubota | H01L 27/1266 |
| 2017/0179423 A1* | 6/2017 | Kwon | H10K 77/111 |
| 2017/0228209 A1* | 8/2017 | Watanabe | G06F 3/1446 |
| 2017/0301266 A1* | 10/2017 | Zhang | G06F 3/0412 |
| 2017/0309604 A1* | 10/2017 | Kim | H01L 25/167 |
| 2017/0317299 A1* | 11/2017 | Choi | H10K 77/111 |
| 2017/0338246 A1* | 11/2017 | Kubota | G02F 1/133528 |
| 2017/0338250 A1* | 11/2017 | Yanaka | H01L 23/293 |
| 2017/0345881 A1* | 11/2017 | Kim | H10K 59/123 |
| 2017/0345883 A1* | 11/2017 | Song | H10K 59/123 |
| 2017/0358642 A1* | 12/2017 | Jo | H01L 25/18 |
| 2018/0004344 A1* | 1/2018 | Park | G06F 3/04164 |
| 2018/0061910 A1* | 3/2018 | Cai | H10K 59/131 |
| 2018/0083075 A1* | 3/2018 | Jung | H10K 77/111 |
| 2018/0114819 A1* | 4/2018 | Kang | H10K 59/123 |
| 2018/0136766 A1* | 5/2018 | Kim | G02B 5/30 |
| 2018/0241001 A1* | 8/2018 | Park | H10K 50/844 |
| 2018/0342566 A1* | 11/2018 | Khachatryan | B32B 27/281 |
| 2019/0013493 A1* | 1/2019 | Sonoda | H10K 50/841 |
| 2019/0096977 A1* | 3/2019 | Yamazaki | H10K 71/50 |
| 2019/0189551 A1* | 6/2019 | Ha | H01L 21/4853 |
| 2019/0326378 A1* | 10/2019 | Kim | H10K 77/111 |
| 2020/0103691 A1* | 4/2020 | Ohashi | G02F 1/13452 |
| 2020/0259116 A1* | 8/2020 | Chida | H10K 59/131 |
| 2022/0066096 A1* | 3/2022 | Chen | H01L 21/78 |
| 2024/0021627 A1* | 1/2024 | Kim | H01L 27/124 |
| 2024/0032363 A1* | 1/2024 | Seo | H10K 77/111 |

FOREIGN PATENT DOCUMENTS

| | | |
|---|---|---|
| CN | 103094306 | 5/2013 |
| CN | 106324927 | 1/2017 |
| CN | 106409796 | 2/2017 |
| EP | 2991116 | 3/2016 |
| JP | 2003100450 | 4/2003 |
| JP | 2004-349152 | 12/2004 |
| JP | 2009-053350 | 3/2009 |
| JP | 2015-015232 | 1/2015 |
| JP | 2016-106363 | 6/2016 |
| KR | 10-2014-0099139 | 8/2014 |

OTHER PUBLICATIONS

Notice of Allowance dated Oct. 25, 2019, in U.S. Appl. No. 15/906,628.

Non-Final Office Action dated Apr. 2, 2019, in U.S. Appl. No. 15/906,628.

Examination Report dated Oct. 20, 2020, in European Patent Application No. 18158958.1.

Notice of Allowance dated Oct. 7, 2020, in U.S. Appl. No. 16/783,733.

Notice of Allowance dated Dec. 18, 2020, in U.S. Appl. No. 16/783,733.

Notice of Allowance dated Jul. 5, 2023, in U.S. Appl. No. 17/142,220.

* cited by examiner

DISPLAY APPARATUS INCLUDING CONDUCTIVE PATTERN IN SUBSTRATE AND METHOD OF MANUFACTURING THE SAME

CROSS-REFERENCE TO RELATED APPLICATIONS

This application is a Continuation of U.S. patent application Ser. No. 17/142,220, filed Jan. 5, 2021, which is a Continuation of U.S. patent application Ser. No. 16/783,733, filed Feb. 6, 2020, which issued as U.S. Pat. No. 10,916,619, which is a Division of U.S. patent application Ser. No. 15/906,628, filed Feb. 27, 2018, which issued as U.S. Pat. No. 10,580,846, which claims priority to and the benefit of Korean Patent Application No. 10-2017-0026462, filed Feb. 28, 2017, each of which is hereby incorporated by reference for all purposes as if fully set forth herein.

BACKGROUND

Field

The disclosure generally relates to a display apparatus and a method of manufacturing the same, and more particularly, to a display apparatus having a peripheral region of a reduced area and a method of manufacturing the same.

Discussion

Display apparatuses include, for example, liquid crystal displays, organic light-emitting displays, plasma displays, field emission displays, electrophoretic displays, electrowetting displays, and the like. Display apparatuses typically include a display panel and a controller that controls an operation of the display panel. A portion of the controller used to drive the display panel may be included as a component that is independent from the display panel, and the portion of the controller may be connected to a pad formed on the display panel. Consumers may also demand display apparatuses with a small bezel. When a bezel is enlarged, a display region that displays an image looks relatively small, and the display apparatus may appear excessively large as compared with the display region.

The above information disclosed in this section is only for enhancement of an understanding of the background of the inventive concepts, and, therefore, it may contain information that does not form prior art already known to a person of ordinary skill in the art.

SUMMARY

Some exemplary embodiments are capable of providing a display apparatus having an area-minimized (or reduced) peripheral region through connection of an external circuit terminal to a conductive pattern exposed at a back surface of a display panel of the display apparatus.

Some exemplary embodiments are capable of providing a method of manufacturing a display apparatus having an area-minimized (or area-reduced) peripheral region via connection to an external circuit terminal through a conductive pattern exposed at a back surface of a display panel of the display apparatus.

Additional aspects will be set forth in the detailed description which follows, and, in part, will be apparent from the disclosure, or may be learned by practice of the inventive concepts.

According to some exemplary embodiments, a display apparatus includes a display region and a peripheral region adjacent to the display region. The display apparatus further includes a first flexible substrate, a driving circuit, a conductive pattern, a conductive line, a light-emitting device, and a support substrate. The first flexible substrate includes a first surface and a second surface opposite the first surface. The second surface includes, in the peripheral region, a cavity extending into the first flexible substrate. The driving circuit is on the first surface and includes at least one transistor. The conductive pattern is in the cavity and is partially exposed by the cavity. The conductive line electrically connects the conductive pattern to the driving circuit. The light-emitting device is in the display region and is electrically connected to the driving circuit. The support substrate is on the second surface. In a view normal to the second surface, the support substrate is spaced apart from the conductive pattern.

According to some exemplary embodiments, a method of manufacturing a display apparatus including a display region and a peripheral region, includes: forming a second flexible substrate on a carrier substrate; forming a conductive pattern on the second flexible substrate in the peripheral region; forming a first flexible substrate on the second flexible substrate; forming, on a first surface of the first flexible substrate, a driving circuit including at least one transistor, and a conductive line electrically connecting the conductive pattern to the driving circuit; forming, in the display region, a light-emitting device electrically connected to the driving circuit; exposing the conductive pattern by removing the carrier substrate and at least a portion of the second flexible substrate; and forming a support substrate on a second surface of the first flexible substrate such that the conductive pattern is exposed, the second surface being opposite the first surface.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
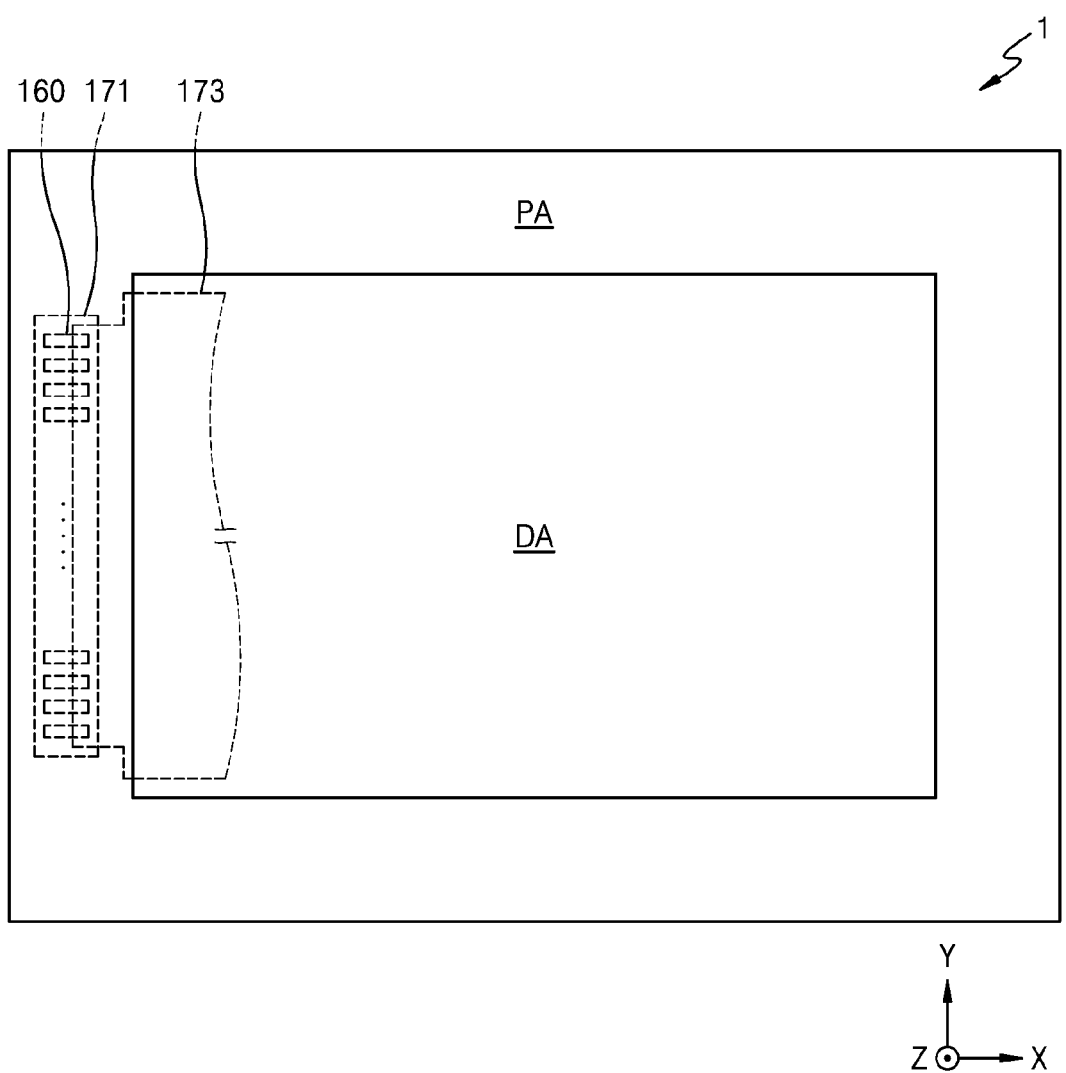
FIG. 1 is a schematic plan view of a display apparatus according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
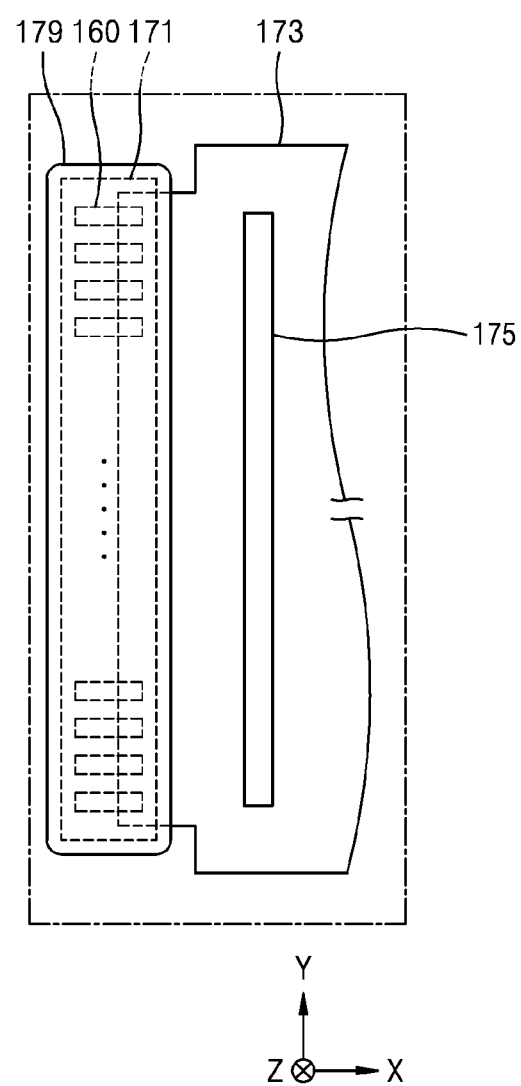
FIG. 2 is a schematic view of a portion of a back surface of the display apparatus of FIG. 1 according to some exemplary embodiments.
Figure 3:
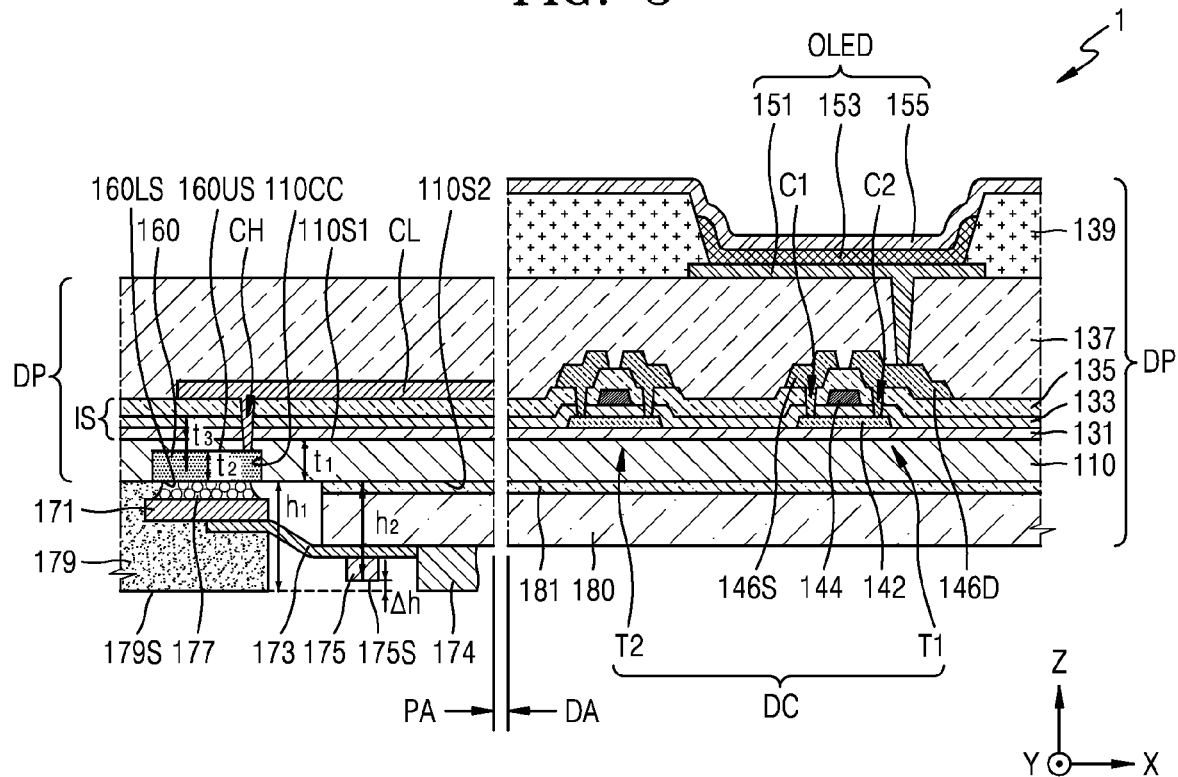
FIG. 3 is a partial cross-sectional view of the display apparatus of FIG. 1 taken along a first direction according to some exemplary embodiments.
Figure 4:
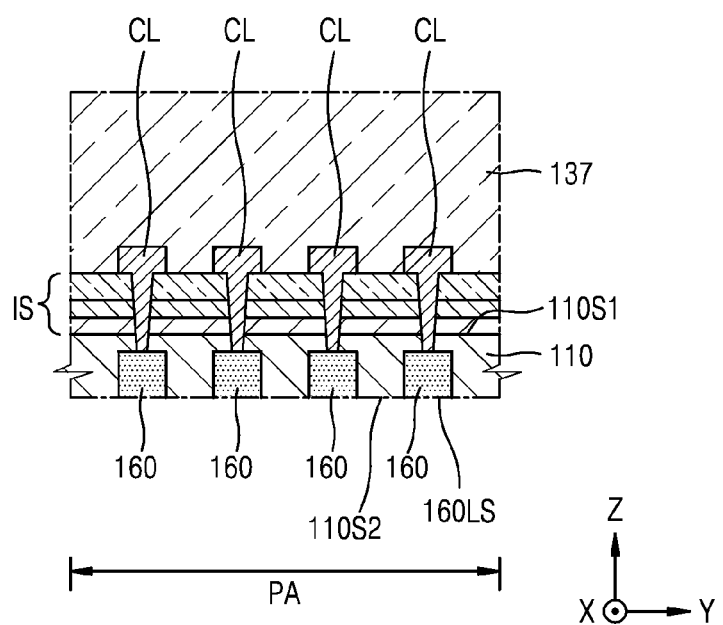
FIG. 4 is a partial cross-sectional view of the display apparatus of FIG. 1 taken along a second direction according to some exemplary embodiments.

FIG. 1 is a schematic plan view of a display apparatus according to some exemplary embodiments. FIG. 2 is a schematic view of a portion of a back surface of the display apparatus of FIG. 1 according to some exemplary embodiments. FIG. 3 is a partial cross-sectional view of the display apparatus of FIG. 1 taken along a first direction according to some exemplary embodiments. FIG. 4 is a partial cross-sectional view of the display apparatus of FIG. 1 taken along a second direction according to some exemplary embodiments.

Referring to FIGS. 1-4, the display apparatus 1 includes a first flexible substrate 110 having a first surface 110S1 and a second surface 110S2 opposite to the first surface 110S1, the second surface 110S2 including a concave portion 110CC, a driving circuit unit (or driving circuit) DC disposed on the first surface 110S1 of the first flexible substrate 110 and including at least one transistor (e.g., transistor T1), a conductive pattern 160 disposed in the concave portion 110CC included in the second surface 110S2 and partially exposed, a conductive line CL electrically connecting the conductive pattern 160 to the driving circuit unit DC, a light-emitting device OLED driven by the driving circuit unit DC, and a support substrate 180 disposed on the second surface 110S2 of the first flexible substrate 110 so as not to overlap with the conductive pattern 160. When "on the first surface 110S1 of the first flexible substrate 110" is set to be "above the first flexible substrate 110," "on the second surface 110S2 of the first flexible substrate 110" may be interpreted as "beneath the first flexible substrate 110."

The display apparatus 1 includes a display region DA where an image is displayed, and a peripheral region PA surrounding at least a portion of the display region DA. In the display region DA, a plurality of light-emitting devices OLED may be arranged. In the peripheral region PA, a pad for connecting, to a driving unit outside of a panel, conductive lines CL for transmitting an electrical signal to the driving circuit unit DC, which drives the light-emitting device OLED, namely, the conductive pattern 160, may be arranged.

According to some exemplary embodiments, the conductive pattern 160 may be arranged on a back surface of a display panel DP such that at least a portion of the conductive pattern 160 is exposed to the outside. The conductive pattern 160 may include a plurality of conductive patterns 160 respectively connected to a plurality of conductive lines CL for driving a plurality of pixels arranged on the display region DA. The plurality of conductive patterns 160 may include at least one of a conductive pattern connected to a scan line that transmits a scan signal, a conductive pattern connected to a data line that transmits a data signal, and a conductive pattern connected to a voltage line for applying a driving voltage. The back surface of the display panel DP denotes a surface opposite to a surface on which an image is displayed.

Referring to FIG. 3, the first flexible substrate 110 is arranged on the conductive pattern 160. Because the conductive pattern 160 is exposed at the back surface of the display panel DP, the first flexible substrate 110 may cover the conductive pattern 160 such that a lower surface 160LS of the conductive pattern 160 is exposed. In other words, the first flexible substrate 110 may cover an upper surface 160US and lateral surfaces of the conductive pattern 160, but not cover the lower surface 160LS of the conductive pattern 160. According to some exemplary embodiments, the first flexible substrate 110 may include the concave portion 110CC on the second surface 110S2 opposite to the first surface 110S1, and at least a portion of the conductive pattern 160 may be arranged in the concave portion 110CC. Accordingly, at least a portion of the conductive pattern 160 may be buried in the first flexible substrate 110.

The first flexible substrate 110 may include any suitable material. For example, the first flexible substrate 110 may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose acetate propionate (CAP), and the like. According to some exemplary embodiments, the first flexible substrate 110 may include PI having good bending characteristics, and may have a thickness of several micrometers ($\mu m$) to several tens of micrometers ($\mu m$).

The driving circuit unit DC including the at least one transistor T1 may be disposed on the first surface 110S1 of the first flexible substrate 110, and the transistor T1 may include an active layer 142 including, for example, amorphous silicon, polycrystalline silicon, an organic semiconductor material, and/or the like, and a gate electrode 144 insulated from the active layer 142. According to some exemplary embodiments, the transistor T1 may further include a source electrode 146S and a drain electrode 146D. The source electrode 146S and the drain electrode 146D may be electrically connected to the active layer 142 via contact holes C1 and C2, respectively.

To secure insulation between the active layer 142 and the gate electrode 144, a gate insulation layer 133 may be between the active layer 142 and the gate electrode 144. The gate insulation layer 133 may include an inorganic material, such as silicon oxide, silicon nitride, and/or silicon oxynitride. An interlayer insulation layer 135 may be on the gate electrode 144 and may include an inorganic material, such as silicon oxide, silicon nitride, and/or silicon oxynitride, and the source electrode 146S and the drain electrode 146D may be on the interlayer insulation layer 135.

The driving circuit unit DC may further include a transistor T2 performing a switching function, a plurality of transistors, and at least one capacitor performing various other functions, in addition to the transistor T1. The driving circuit unit DC may be electrically connected to the light-emitting device OLED to drive the light-emitting device OLED.

A buffer layer 131 may be between the transistor T1 and the first flexible substrate 110 and may include an inorganic material, such as, silicon oxide, silicon nitride, and/or silicon oxynitride. The buffer layer 131 may increase smoothness of an upper surface of the first flexible substrate 110 and/or prevent, minimize, or reduce infiltration of impurities from the first flexible substrate 110 and the like into the active layer 142 of the transistor T1.

A planarization layer 137 may be disposed on the transistor T1. For example, when an organic light-emitting device is disposed over the transistor T1 as illustrated in FIG. 3, the planarization layer 137 may planarize an upper surface of the driving circuit unit DC including the transistor T1. The planarization layer 137 may be formed of an organic material, such as, acryl, PI, benzocyclobutene (BCB), or hexamethyldisiloxane (HMDSO). Although the buffer layer 131, the gate insulation layer 133, the interlayer insulation layer 135, and the planarization layer 137 are single layers in FIG. 3, they may be multi-layers.

The conductive line CL may be disposed on the first surface 110S1 of the first flexible substrate 110. The conductive line CL is electrically connected to the driving circuit unit DC and the conductive pattern 160 to electrically connect the driving circuit unit DC to the conductive pattern 160. The driving circuit unit DC may include a plurality of transistors, a capacitor, and a connection line that connects them, and thus, the conductive line CL may be a line that applies a scan signal, a data signal, or a voltage to the driving circuit unit DC. As shown in FIG. 4, the conductive line CL may include a plurality of conductive lines CL separated (or spaced apart) from each other, and the conductive pattern 160 may include a plurality of conductive patterns 160 respectively connected to the plurality of conductive lines CL and separated from each other.

The plurality of conductive lines CL may be one of a scan line, a data line, and a driving voltage line, or may be a combination of the scan line, the data line, and the driving voltage line. The plurality of conductive lines CL may be arranged on the same layer or on different layers. The plurality of conductive lines CL are insulated from each other. Although not shown in FIG. 4, the plurality of conductive lines CL may be aligned with and connected to terminals included in a connector 171 using a conductive adhesive 177. FIG. 4 does not illustrate the conductive adhesive 177, the connector 171, a flexible printed circuit board (PCB) 173, and a protection layer 179, and thereby, only illustrates some of the components arranged in the peripheral region PA.

According to some exemplary embodiments, the conductive line CL may be disposed on the same layer on which the source electrode 146S and the drain electrode 146D of the transistor T1 are disposed, and may include the same material as that used to form the source electrode 146S and the drain electrode 146D. For example, the conductive line CL may be a data line that transmits a data signal, and may include a first layer including titanium (Ti), a second layer including aluminum (Al), and a third layer including Ti. However, embodiments are not limited thereto or thereby, and the conductive line CL may be formed of at least one of aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), and copper (Cu) in a single-layered or multi-layered structure. However, embodiments are not limited thereto or thereby, and the conductive line CL may be arranged on the same layer on which the gate electrode 144 is arranged, and may include the same material as that used to form the gate electrode 144. For example, the gate electrode 144 and the conductive line CL may be formed of Mo.

Although not shown in FIGS. 1-4, the conductive line CL may extend from the display region DA to the peripheral region PA, and at least a portion of the conductive line CL may overlap the conductive pattern 160 in a plan view, e.g., when viewed in a direction normal to the first surface 110S1 of the first flexible substrate 110.

An insulation structure IS and at least a portion of the first flexible substrate 110 may be arranged between the conductive line CL and the conductive pattern 160, and the conductive line CL and the conductive pattern 160 may be electrically connected to each other via a contact hole CH formed in the insulation structure IS and the first flexible substrate 110. Although the insulation structure IS is shown including the buffer layer 131, the gate insulation layer 133, and the interlayer insulation layer 135 in FIG. 3, embodiments are not limited thereto or thereby. The insulation structure IS may refer to a layer including at least one of a buffer layer, a gate insulation layer, an interlayer insulation layer, and an additional insulation layer. In other words, insulation structures shown in drawings other than FIG. 3 are not limited to a structure including the buffer layer 131, the gate insulation layer 133, and the interlayer insulation layer 135.

The light-emitting device OLED may be disposed in the display region DA over the interlayer insulation layer 135. Although the light-emitting device OLED is an organic light-emitting device in FIG. 3, embodiments are not limited thereto or thereby, and the location of the light-emitting device OLED is also not limited to over the interlayer insulating layer 135.

The light-emitting device OLED includes a pixel electrode 151, an opposite electrode 155, and an intermediate layer 153 including an emission layer. The pixel electrode 151 contacts one of the source electrode 146S and the drain electrode 146D via a hole formed in the planarization layer 137, and is electrically connected to the transistor T1.

A pixel definition layer 139 may be disposed on the planarization layer 137. The pixel definition layer 139 defines a pixel by including a hole through which at least a center portion of the pixel electrode 151 is exposed. The pixel definition layer 139 prevents an arc from occurring on the edge of the pixel electrode 151 by increasing a distance between the edge of the pixel electrode 151 and the opposite electrode 155 disposed over the pixel electrode 151. The pixel definition layer 139 may be formed of an organic material, for example, PI or HMDSO.

The pixel electrode 151 may be a reflection electrode including a reflection layer. For example, the reflection layer may include at least one of silver (Ag), magnesium (Mg), aluminum (Al), platinum (Pt), palladium (Pd), gold (Au), nickel (Ni), neodymium (Nd), iridium (Jr), and chromium (Cr). A transparent or semitransparent electrode layer may be further formed on the reflection layer and may be formed of at least one of indium tin oxide (ITO), indium zinc oxide (IZO), zinc oxide (ZnO), indium oxide ($In_2O_3$), indium gallium oxide (IGO), and aluminum zinc oxide (AZO). According to some exemplary embodiments, the pixel electrode 151 may include a triple layer of ITO/Ag/ITO.

The intermediate layer 153 of the light-emitting device OLED includes an organic emission layer, and may further include at least one of a hole injection layer (HIL), a hole transport layer (HTL), an electron transport layer (ETL), and an electron injection layer (EIL). However, embodiments are not limited thereto or thereby, and the intermediate layer 153 may further include various other functional layers. In other words, the intermediate layer 153 is not limited to the aforementioned structure, and may have any of various other structures. The intermediate layer 153 may include a single layer that covers a plurality of pixel electrodes 151 or may include patterned layers respectively corresponding to the plurality of pixel electrodes 151.

To emit white light, the organic emission layer may have a multi-layered structure in which a red light-emission layer, a green light-emission layer, and a blue light-emission layer are stacked, or have a single-layered structure including a red light-emission material, a green light-emission material, and a blue light-emission material. An organic light-emitting device having such an organic emission layer may further include a red color filter, a green color filter, and a blue color filter to thereby emit a full color.

The opposite electrode 155 may be a transparent (or semi-transparent) electrode. For example, the opposite electrode 155 may include at least one of Ag, Al, Mg, Li, Ca, Cu, LiF/Ca, LiF/Al, MgAg, and CaAg, and may be formed of a thin film having a thickness of several nanometers (nm) to several tens of nanometers (nm). According to some exemplary embodiments, the light-emitting device OLED may be of a top-emission type that emits light toward a front surface of the display panel DP, namely, in a third direction z.

An encapsulation layer (not shown) may be arranged on the light-emitting device OLED to cover the light-emitting device OLED. The encapsulation layer may protect the light-emitting device OLED from external moisture, oxygen, and/or other contaminants.

The support substrate 180 may be disposed on the second surface 110S2 of the first flexible substrate 110. Here, "on the second surface 110S2" denotes the side opposite to a side on which the light-emitting device OLED of the first flexible substrate 110 is disposed. The support substrate 180 may have higher stiffness than the first flexible substrate 110 and may include a polymer resin, such as PES, PAR, PEI, PEN, PET, PPS, polyallylate, PI, PC, or CAP. According to some exemplary embodiments, the support substrate 180 may include PEN or PET and may have a greater thickness than the first flexible substrate 110 including PI.

An adhesion layer 181 may be disposed between the support substrate 180 and the first flexible substrate 110. As will be described later, the support substrate 180 is a component that is formed on the second surface 110S2 of the first flexible substrate 110 after the driving circuit unit DC and the light-emitting device OLED are formed on the first flexible substrate 110. For example, the support substrate 180 may be attached to the second surface 110S2 of the first flexible substrate 110 using the adhesion layer 181.

The support substrate 180 is not disposed in a region where the conductive pattern 160 is disposed. In other words, the support substrate 180 may be disposed such that the conductive pattern 160 is exposed. In other words, the support substrate 180 and the conductive pattern 160 may be arranged so as not to overlap with each other in a plan view.

The conductive pattern 160 of which the lower surface 160LS is exposed at the back surface of the display panel DP, namely, at the first flexible substrate 110, is electrically connected to the flexible PCB 173 for electrically connecting a main circuit unit (or main circuit) 174 to the conductive pattern 160. According to some exemplary embodiments, the conductive pattern 160 and the flexible PCB 173 may be electrically connected to each other by the connector 171, and the conductive adhesive 177 may be disposed between the connector 171 and the conductive pattern 160. An electronic chip 175 may be disposed on the flexible PCB 173.

However, the structure shown in FIG. 3 for connecting the conductive pattern 160 to the main circuit unit 174 is merely an example, and embodiments are not limited thereto or thereby. For instance, according to another exemplary embodiment, the electronic chip 175 may be disposed on the conductive pattern 160, and the electronic chip 175 and the main circuit unit 174 may be electrically connected to each other by the flexible PCB 173. A connector or the like rather than the conductive adhesive 177 may be used as connecting means.

According to some exemplary embodiments, the protection layer 179 for protecting exposed metal or the like may be disposed on the conductive pattern 160 and at least a portion of the flexible PCB 173. The protection layer 179 may be an inorganic insulation layer including silicon and the like. As shown in FIG. 2, the protection layer 179 may be disposed to cover at least a portion of the edge of the flexible PCB 173.

Referring to FIG. 3, the protection layer 179 and the electronic chip 175 are disposed at the outside of the flexible PCB 173, e.g., below the flexible PCB 173. In this case, a lower surface 175S of the electronic chip 175 may be disposed such that a distance from the lower surface 175S to the second surface 110S2 of the first flexible substrate 110 is less than from a lower surface 179S of the protection layer 179 to the second surface 110S2. By doing this, the protection layer 179 functions as a bumper to protect the electronic chip 175 from external impact. A distance by which the lower surface 175S of the electronic chip 175 may be closer to the second surface 110S2 of the first flexible substrate 110 than the lower surface 179S of the protection layer 179 may be a determined height Δh. In other words, a distance hi between the lower surface 179S of the protection layer 179 and the second surface 110S2 of the first flexible substrate 110 may be greater than a distance h 2 between the lower surface 175S of the electronic chip 175 and the second surface 110S2 of the first flexible substrate 110. The second surface 110S2 of the first flexible substrate 110, which is a base location, denotes a portion of the second surface 110S2 other than a portion on which the concave portion 110CC is disposed.

Referring to FIG. 3, a portion of the first flexible substrate 110 other than the portion including the concave portion 110CC may have a first thickness $t_1$, the conductive pattern 160 may have a second thickness $t_2$, and the second thickness $t_2$ may have a value of about 700 nm or less, but greater than 0 nm. The portion of the first flexible substrate 110 that is over the conductive pattern 160 has a third thickness $t_3$. Although the third thickness $t_3$ is substantially the same as a difference between the first thickness $t_1$ and the second thickness $t_2$ in FIG. 3, embodiments are not limited thereto or thereby. In other words, the third thickness $t_3$ may vary according to the degree to which the conductive pattern 160 is buried in the first flexible substrate 110 and a bending shape of the upper surface of the first flexible substrate 110.

According to some exemplary embodiments, the first flexible substrate 110 may include a photosensitive organic material. In this case, regardless of the value of the third thickness $t_3$, a hole corresponding to the contact hole CH for connecting the conductive line CL to the conductive pattern 160 may be easily formed in the first flexible substrate 110 using photolithography or the like. Via the hole corresponding to the contact hole CH, the conductive pattern 160 may be partially exposed. However, according to another embodiment, the first flexible substrate 110 may include an organic material other than the photosensitive organic material. In this case, the third thickness $t_3$ may have a relatively smaller value than the first thickness $t_1$, for example, a value of several nm to several hundreds of nm.

By setting the third thickness $t_3$ to be relatively small, a portion of the first flexible substrate 110 corresponding to the contact hole CH is completely removed using, for instance, plasma processing and ashing, and, thus, the hole corresponding to the contact hole CH may be formed in the first flexible substrate 110. The viscosity of an organic material, for example, PI, used to form the first flexible substrate 110 may be 20000 centipoise (cP) or less, but greater than 0 cP so that the third thickness $t_3$ has a small value. In other words, the first flexible substrate 110 covering the conductive pattern 160 may be formed using an organic material having a low viscosity so that the third thickness $t_3$ of the portion of the first flexible substrate 110 over the conductive pattern 160 has a relatively small value. According to some exemplary embodiments, the third thickness $t_3$ of the portion of the first flexible substrate 110 over the conductive pattern 160 may be about a quarter of the second thickness $t_2$ of the conductive pattern 160, and may have a value of about 150 nm or less, but greater than 0 nm. In this manner, the portion of the first flexible substrate 110 over the conductive pattern 160 may be easily removed using plasma processing and ashing; however, exemplary embodiments are not limited thereto or thereby. In another embodiment, the third thickness $t_3$ may be 0, which is described later.

According to some exemplary embodiments, the display apparatus 1 includes the conductive pattern 160 exposed at the back surface of the display panel DP and connects the flexible PCB 173 to the conductive pattern 160. Thus, the area of the peripheral region PA of the display apparatus 1 may be minimized or at least reduced.

FIGS. 5A, 5B, 5C, 5D, 5E, 5F, 5G, 5H, 5I, 5J, and 5K are cross-sectional views of the display apparatus 1 of FIG. 1 at various stages of manufacture according to some exemplary embodiments. Accordingly, a process of manufacturing display apparatus 1 will be described in association with FIGS. 3 and 5A-5K.

Figure 5A:
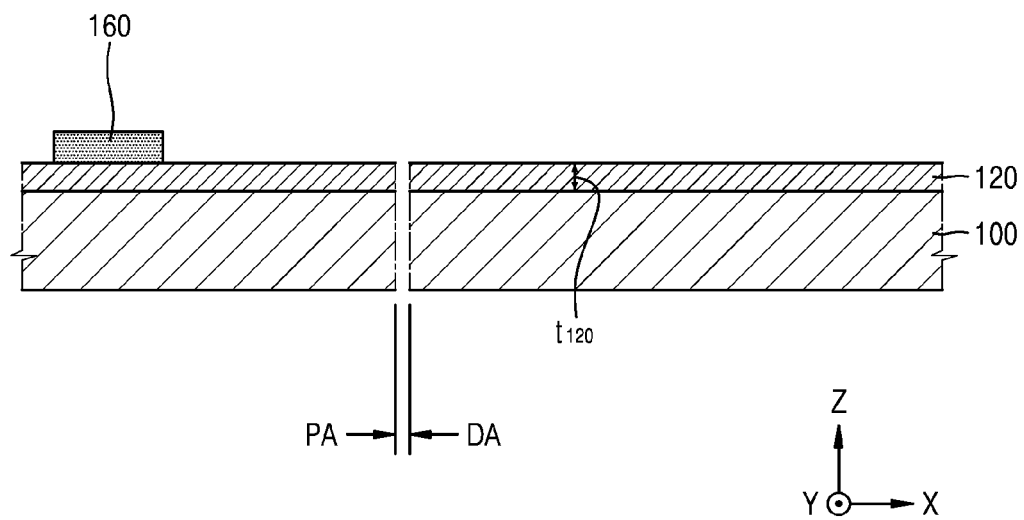
FIGS. 5A, 5B, 5C, 5D, 5E, 5F, 5G, 5H, 5I, 5J, and 5K are cross-sectional views of the display apparatus of FIG. 1 at various stages of manufacture according to some exemplary embodiments.

Referring to FIG. 5A, a second flexible substrate 120 is formed on a carrier substrate 100 including glass and the like, and then the conductive pattern 160 is formed on the second flexible substrate 120. The second flexible substrate 120 may include the same material as that used to form the first flexible substrate 110. For example, the second flexible substrate 120 may include PI and may have a thickness $t_{120}$ of about 0.1 μm or less. By forming the second flexible substrate 120 to have the thickness $t_{120}$ of about 0.1 μm or less, when the carrier substrate 100 is removed, the second flexible substrate 120 may also be removed. This will be described later.

Figure 5B:
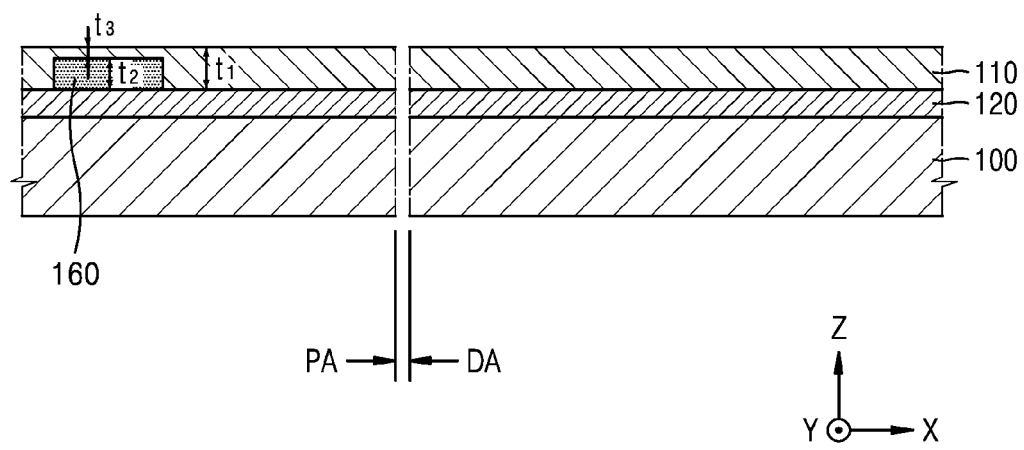

Referring to FIGS. 3 and 5B, the first flexible substrate 110 is formed on the second flexible substrate 120 to cover the conductive pattern 160. The first flexible substrate 110 may include PI. The first flexible substrate 110 may have the first thickness $t_1$, which may be several to several tens of μm. In other words, the first thickness $t_1$ of the first flexible substrate 110 may be greater than the thickness $t_{120}$ of the second flexible substrate 120. The concave portion 110CC may be formed in the second surface 110S2 of the first flexible substrate 110 by the conductive pattern 160. In other words, at least a portion of the conductive pattern 160 may be buried in the concave portion 110CC of the first flexible substrate 110. In this case, the conductive pattern 160 may have the second thickness $t_2$, and a portion of the first flexible substrate 110 corresponding to the concave portion 110CC may have the third thickness $t_3$.

Figure 5C:
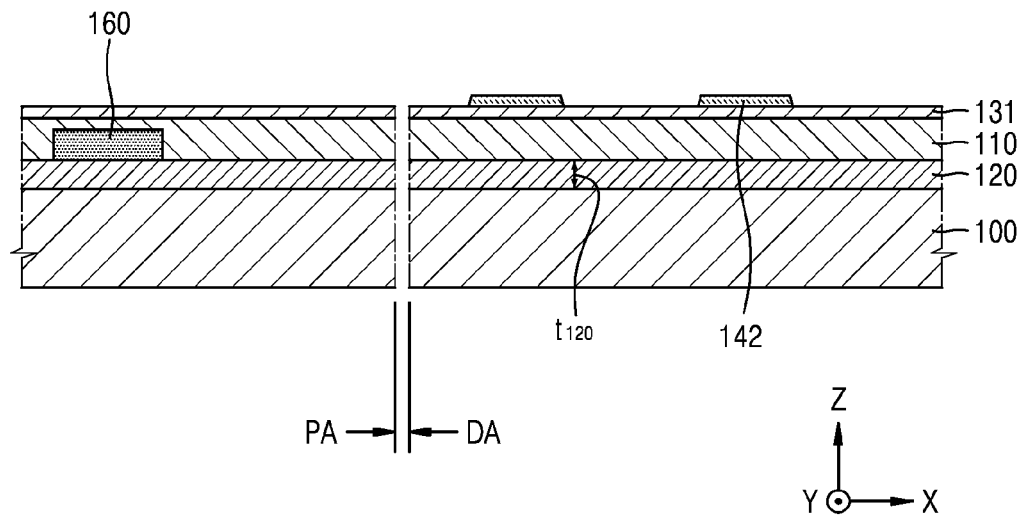

Referring to FIG. 5C, the buffer layer 131, and the active layer 142 of the transistor T1 may be formed on the first flexible substrate 110. The buffer layer 131 may include an inorganic material, such as silicon oxide, silicon nitride, and/or silicon oxynitride, and may be a single layer or a multi-layer structure. The active layer 142 may include amorphous silicon, polycrystalline silicon, or oxide.

Figure 5D:
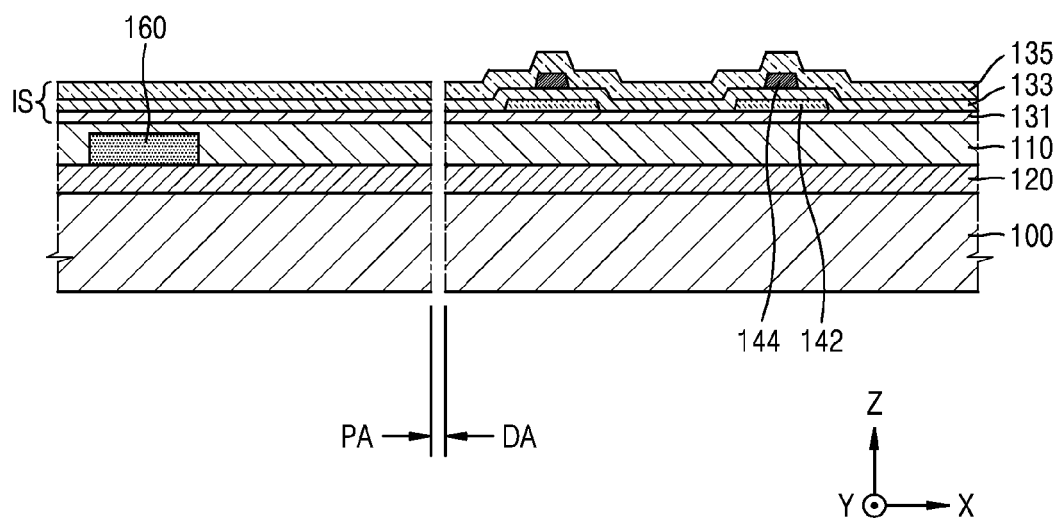

Referring to FIG. 5D, the gate insulation layer 133 may be formed on the buffer layer 131 to cover the active layer 142, and the gate electrode 144 may be formed on the gate insulation layer 133. After the gate electrode 144 is formed, the interlayer insulation layer 135 may be formed on the gate insulation layer 133 to cover the gate electrode 144. The gate insulation layer 133 and the interlayer insulation layer 135 may include an inorganic material, such as silicon oxide, silicon nitride, and/or silicon oxynitride, and may be a single layer or a multi-layer structure. The gate electrode 144 may be a single layer formed of Mo, but embodiments are not limited thereto or thereby.

Figure 5E:
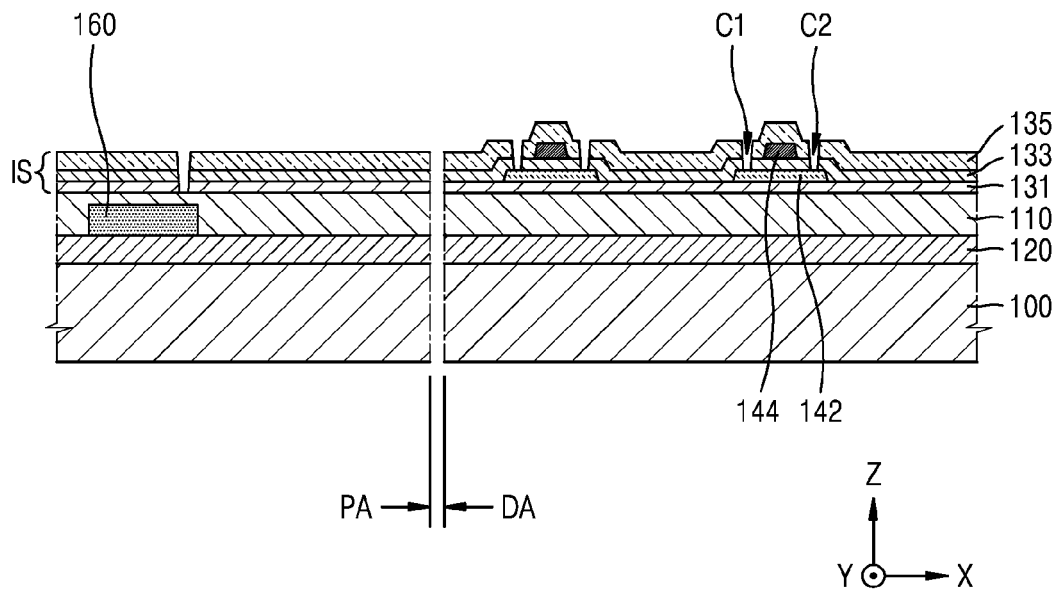

Referring to FIG. 5E, contact holes C1 and C2 for connecting the source electrode 146S and the drain electrode 146D to the active layer 142, respectively, may be formed in the gate insulation layer 133 and the interlayer insulation layer 135. Simultaneously, holes for forming the contact hole CH may be respectively formed in portions of the buffer layer 131, the gate insulation layer 133, and the interlayer insulation layer 135 that are over the conductive pattern 160; however, exemplary embodiments are not limited thereto or thereby. For instance, the holes for forming the contact hole CH may be formed in one or more separate processes. It is noted, however, that because each of the buffer layer 131, the gate insulation layer 133, and the interlayer insulation layer 135 may include an inorganic material, the contact holes C1 and C2 and the holes may be simultaneously formed therein using a single photolithographic process.

Figure 5F:
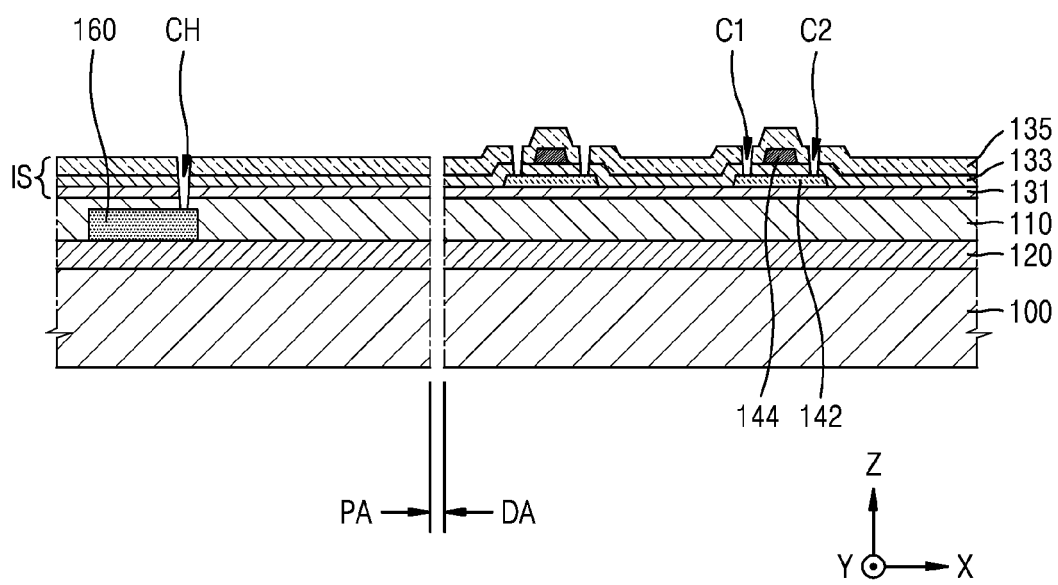

Referring to FIG. 5F, a hole through which a portion of the upper surface of the conductive pattern 160 is exposed may be formed in the first flexible substrate 110. When the first flexible substrate 110 is a photosensitive organic material, the hole may be formed in the first flexible substrate 110 using photolithography. Accordingly, the holes respectively formed in the buffer layer 131, the gate insulation layer 133, the interlayer insulation layer 135, and the first flexible substrate 110 that overlap with each other in a plan view are combined to form the contact hole CH for connecting the conductive line CL to the conductive pattern 160.

When the first flexible substrate 110 is an organic material other than a photosensitive organic material, the third thickness $t_3$ of the area of the first flexible substrate 110 corresponding to the concave portion 110CC may have a relatively small value, for example, a value of about 150 nm or less. By setting the third thickness $t_3$ to be relatively small, a portion of the first flexible substrate 110 exposed via the holes respectively formed in the buffer layer 131, the gate insulation layer 133, the interlayer insulation layer 135 may be easily removed using plasma processing and ashing.

Figure 5G:
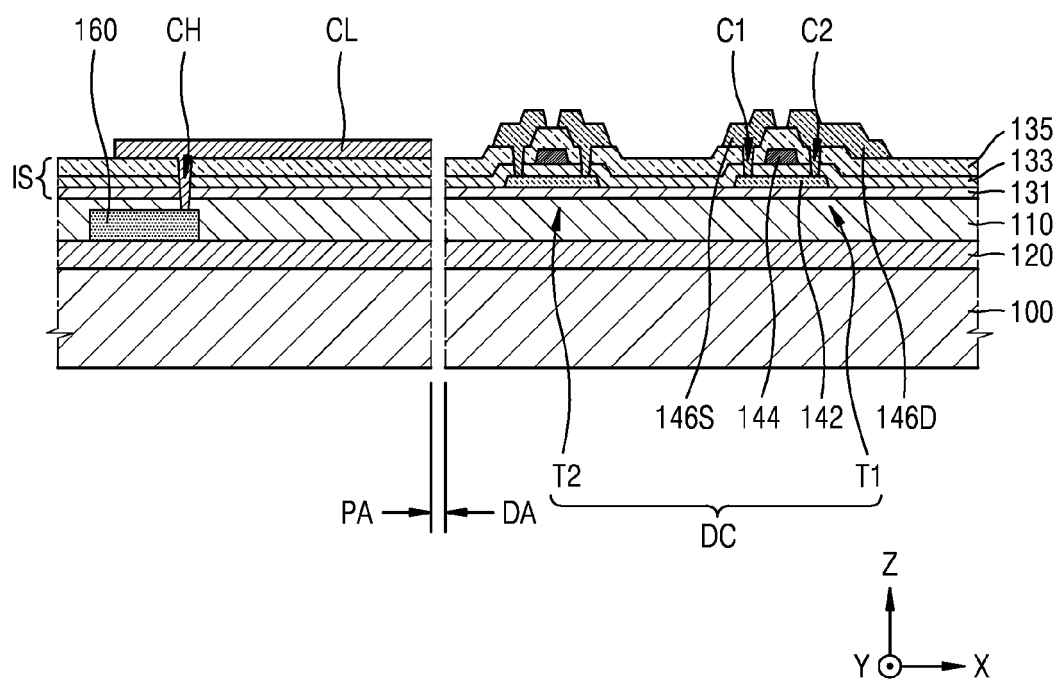

Referring to FIG. 5G, the source electrode 146S and the drain electrode 146D of the transistor T1, and the conductive line CL may be formed on the interlayer insulation layer 135. The conductive line CL may be a data line that transmits a data signal, and may include a first layer including Ti, a second layer including Al, and a third layer including Ti. However, embodiments are not limited thereto or thereby, and the conductive line CL may be formed of any of various materials in a single-layered or multi-layered structure. The conductive line CL may be formed using the same process as the process for forming the gate electrode 144, and not using the same process as the process for forming the source electrode 146S and the drain electrode 146D, and the conductive line CL may be a line that transmits various signals, such as a scan line, a driving voltage line, etc., and, thereby, not the data line.

Figure 5H:
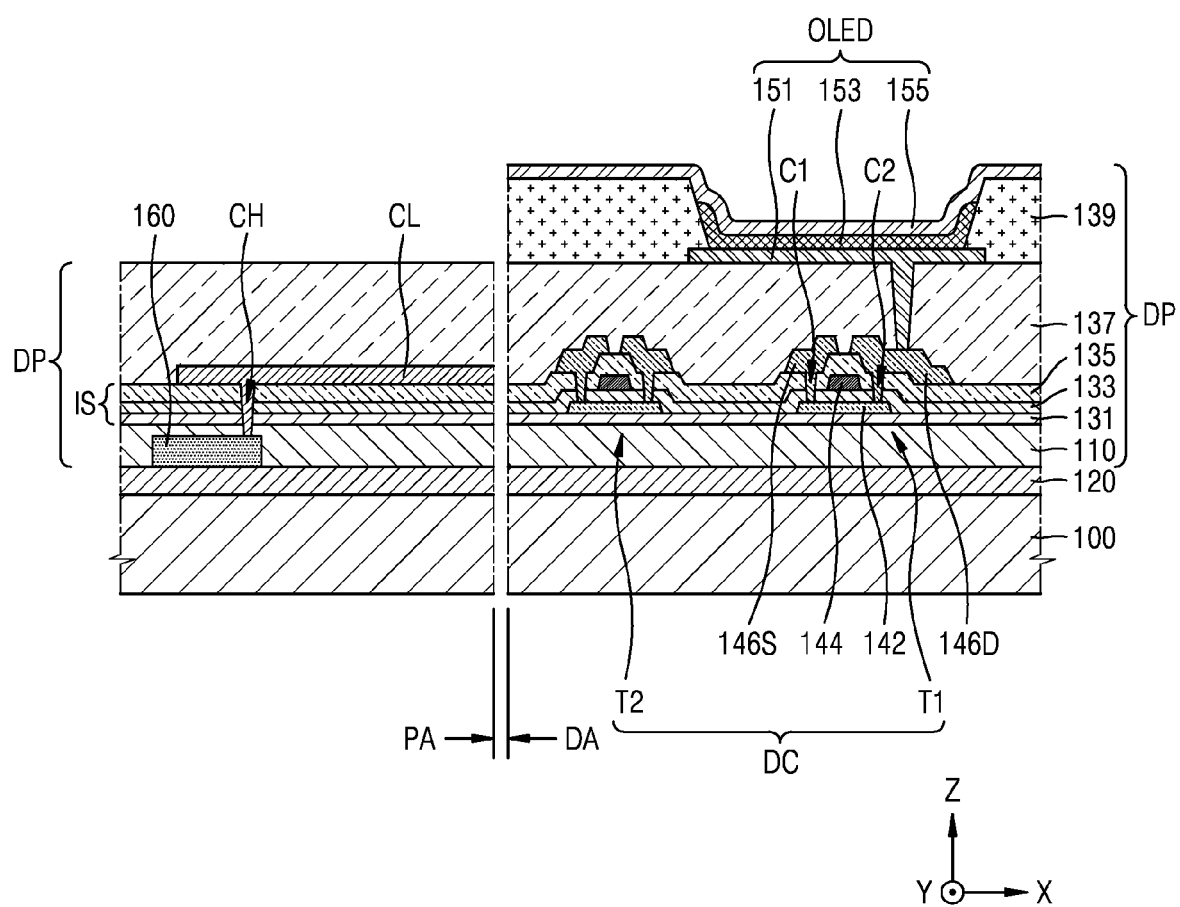

Referring to FIG. 5H, the planarization layer 137 may be formed on the interlayer insulation layer 135 to cover the driving circuit unit DC including, for instance, the transistors T1 and T2. The pixel electrode 151 and then the pixel definition layer 139 including a hole for exposing a central portion of the pixel electrode 151 may be formed on the planarization layer 137 in the display region DA. The intermediate layer 153 including the emission layer and then the opposite electrode 155 may be formed on the pixel electrode 151 exposed through the hole in the pixel definition layer 139. In this manner, the light-emitting device OLED may be formed in the display region DA.

Figure 5I:
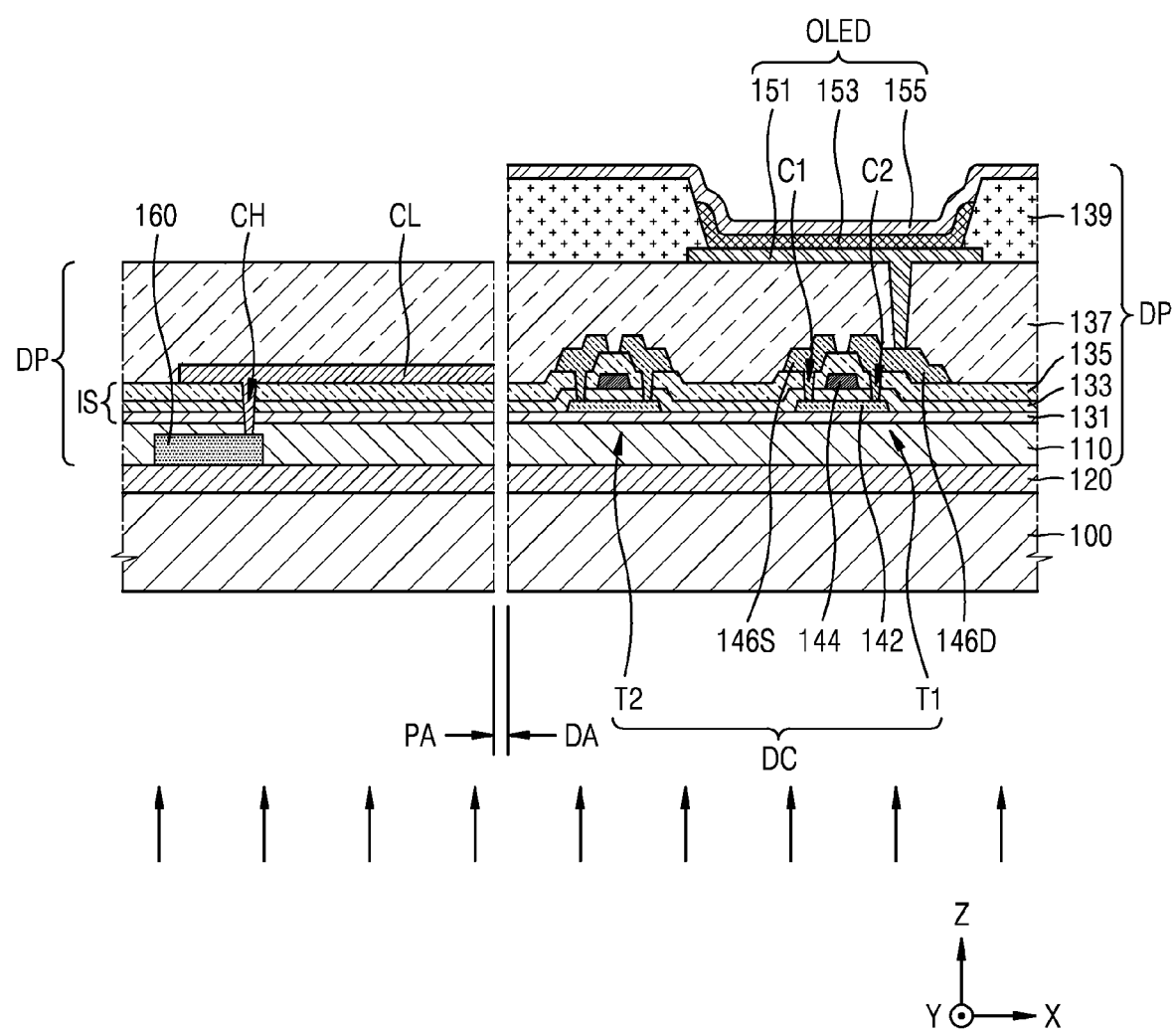
Figure 5J:
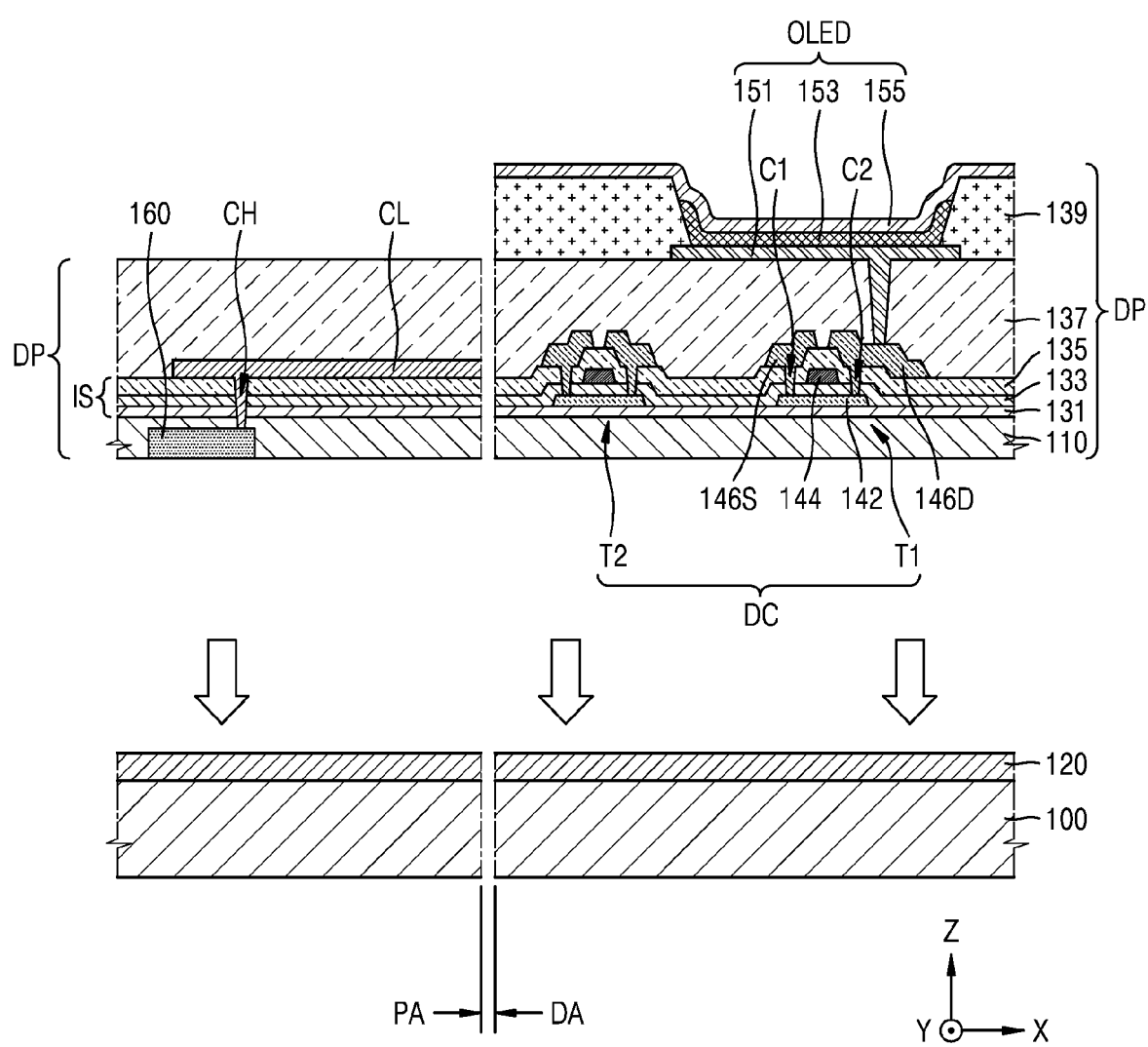

Referring to FIGS. 5I and 5J, a laser may be radiated toward the carrier substrate 100 from below the carrier substrate 100, to thereby remove the carrier substrate 100 and the second flexible substrate 120 from the first flexible substrate 110. As noted in association with FIG. 5A, the second flexible substrate 120 may have the thickness $t_{120}$ of about 0.1 μm or less, and the second flexible substrate 120 may be removed when the carrier substrate 100 is being removed. In other words, the characteristics of the second flexible substrate 120 can be changed by the laser radiation, and, as such, adhesiveness between the second flexible substrate 120 and the first flexible substrate 110 may be broken down. As such, the second flexible substrate 120 may serve as a sacrificial layer that is removed simultaneously with the carrier substrate 100; however, exemplary embodiments are not limited thereto or thereby. That is, the second substrate 120 may be removed separately from the carrier substrate 100. Nevertheless, by removing the carrier substrate 100 and the second flexible substrate 120, the conductive pattern 160 may be exposed through the back surface of the display panel DP, as seen in FIG. 5J.

Figure 5K:
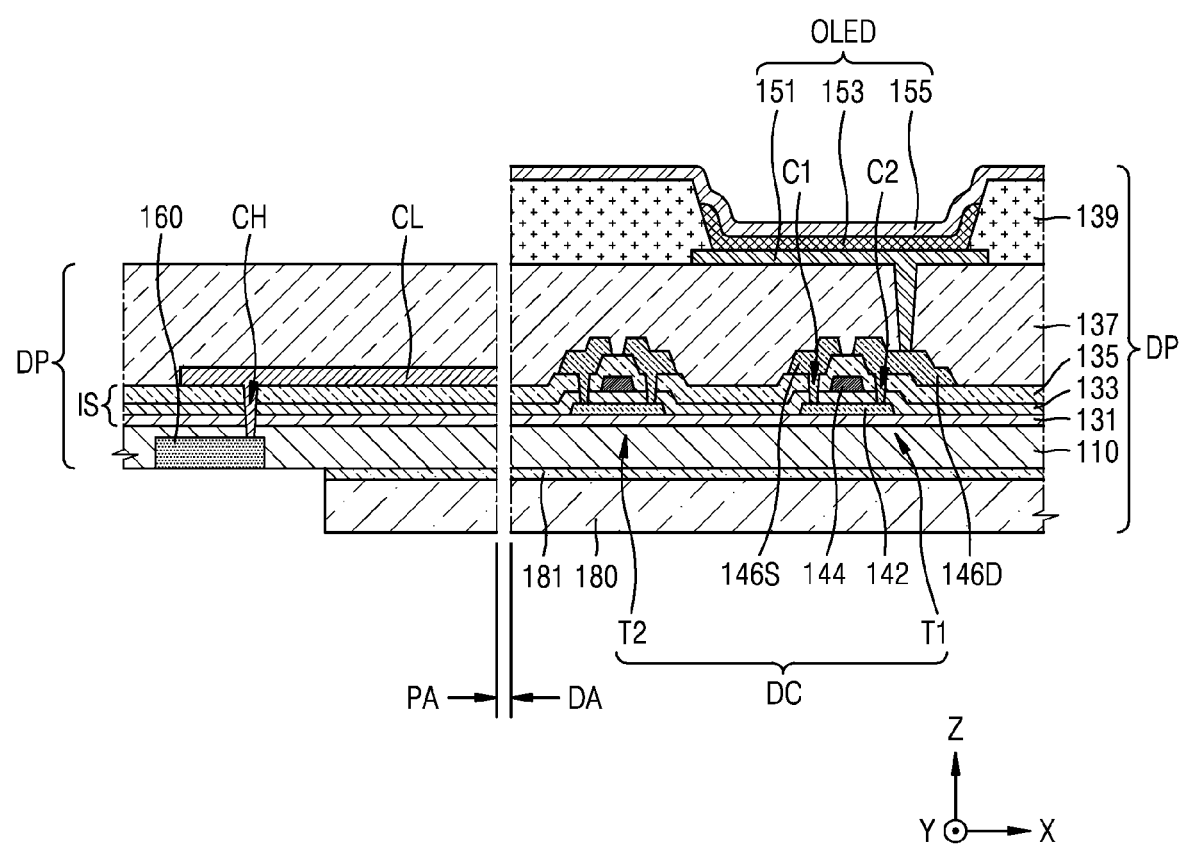

Referring to FIG. 5K, the support substrate 180 may be formed on the second surface 110S2 of the first flexible substrate 110 using the adhesion layer 181. The support substrate 180 is not formed on a portion of the first flexible substrate 110 where the conductive pattern 160 is disposed. Accordingly, the conductive pattern 160 may not be covered by the support substrate 180, and may be exposed at the back surface of the display panel DP.

Referring back to FIG. 3, the connector 171 and the flexible PCB 173 may be connected to the exposed conductive pattern 160 using the conductive adhesive 177. The protection layer 179 may be formed to protect the connector 171, the conductive adhesive 177, and at least a portion of the flexible PCB 173. Further, an electronic chip 175 may be formed on the flexible PCB 173 and a main circuit 174 may be formed on the support substrate 180. The main circuit 174 may be connected to the electronic chip 175 via the flexible PCB 173.

Hereinafter, various figures will be described that illustrate only some of the structures of peripheral regions PA of display apparatuses according to some embodiments. The other structures, such as the display region DA (see, e.g., FIG. 3) and external circuit terminals bonded to the display panel DP (see, e.g., FIG. 3), may be the same as those described in association with FIG. 3 or may be structures modified from those described in association with FIG. 3 based on a known technology.

Figure 6:
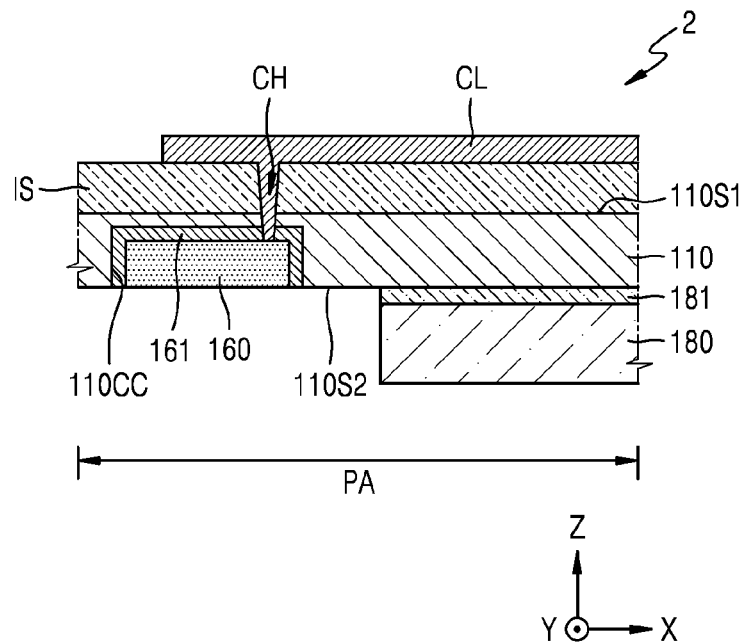
FIG. 6 is a schematic cross-sectional view of a peripheral region of a display apparatus according to some exemplary embodiments.
Figure 7:
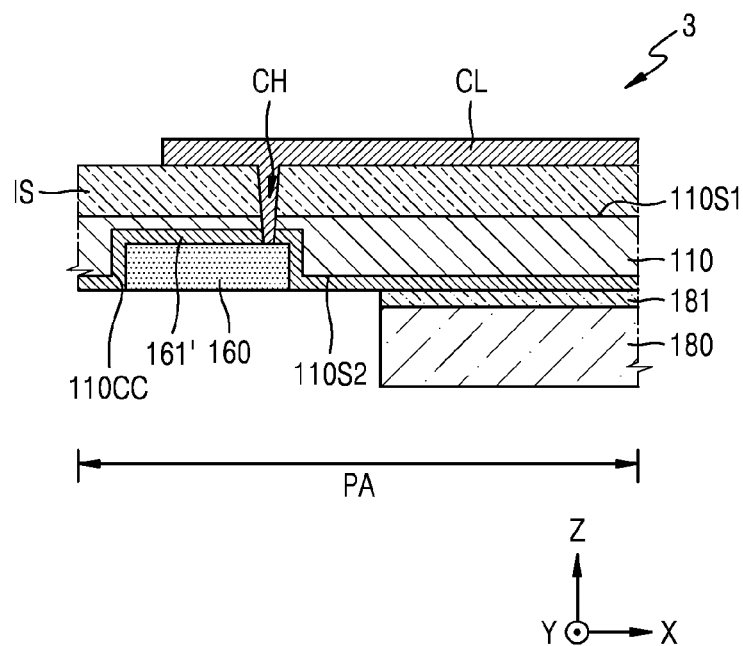
FIG. 7 is a schematic cross-sectional view of a peripheral region of a display apparatus according to some exemplary embodiments.

FIGS. 6 and 7 are schematic cross-sectional views of peripheral regions of display apparatuses according to various exemplary embodiments.

Referring to FIG. 6, the display apparatus 2 includes the first flexible substrate 110 including the concave portion 110CC located on the second surface 110S2, and the conductive pattern 160 is disposed in the concave portion 110CC. In other words, at least a portion of the conductive pattern 160 may be buried in the first flexible substrate 110. An adhesion layer 161 may be disposed between the conductive pattern 160 and the first flexible substrate 110. The adhesion layer 161 may prevent the conductive pattern 160 from being easily separated from the first flexible substrate 110. In this manner, the adhesion layer 161 may cover lateral surfaces and an upper surface of the conductive pattern 160 to prevent the conductive pattern 160 from being easily separated from the first flexible substrate 110. In other words, bondability between the conductive pattern 160 and the adhesion layer 161 and bondability between the adhesion layer 161 and the first flexible substrate 110 may be greater than bondability between the conductive pattern 160 and the first flexible substrate 110. The adhesion layer 161 may include a material that satisfies this condition.

According to some exemplary embodiments, the adhesion layer 161 may include an inorganic material capable of being strongly bonded with metal and the first flexible substrate 110 including an organic material. For example, the inorganic material may be SiNx, A-Si:H, and/or the like. According to some exemplary embodiments, the adhesion layer 161 may include an organic material, such as, hexamethyldisilazane (HMDS), HMDSO, etc.

Referring to FIG. 7, an adhesion layer 161' may be disposed to cover not only the upper surface and lateral surfaces of the conductive pattern 160, but also cover the entire area (or some portion thereof) of the second surface 110S2 of the first flexible substrate 110. In this case, the adhesion layer 161' may also be disposed between the support substrate 180 and the first flexible substrate 110.

Referring to FIGS. 6 and 7, the first flexible substrate 110 is disposed on an adhesion layer 161 or 161', the insulation structure IS is disposed on the first surface 110S1 of the first flexible substrate 110, and the conductive line CL is disposed on the insulation structure IS. The conductive line CL may be connected to the conductive pattern 160 via a contact hole CH formed in the insulation structure IS, the first flexible substrate 110, and the adhesion layer 161 or 161'. The methods of manufacturing the display apparatuses 2 and 3 are substantially the same as or similar to the method described in association with FIGS. 5A-5K, and may further include the operations of forming the adhesion layer 161 or 161' before the operation described in association with FIG. 5B. In other words, the adhesion layer 161 or 161' may be formed on the second flexible substrate 120 (see, e.g., FIG. 5A) to cover the conductive pattern 160, and then the first flexible substrate 110 may be formed.

In the process described in association with FIG. 5J, the carrier substrate 100 and the second flexible substrate 120 are removed, and the adhesion layer 161 or 161' may prevent the conductive pattern 160 together with the second flexible substrate 120 from being separated from the first flexible substrate 110 due to weak bondability between the conductive pattern 160 and the first flexible substrate 110. After the carrier substrate 100 and the second flexible substrate 120 are removed, the support substrate 180 may be formed on the second surface 110S2 of the first flexible substrate 110, and the adhesion layer 181 may be disposed between the first flexible substrate 110 and the support substrate 180. The adhesion layer 181 may be omitted according to a method of forming the support substrate 180 on the first flexible substrate 110.

Figure 8:
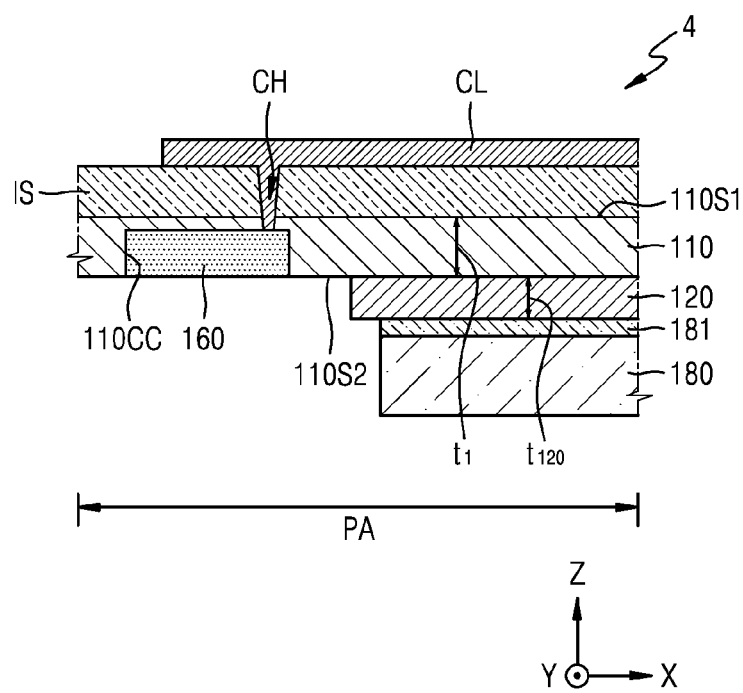
FIG. 8 is a schematic cross-sectional view of a peripheral region of a display apparatus according to some exemplary embodiments.
Figure 9A:
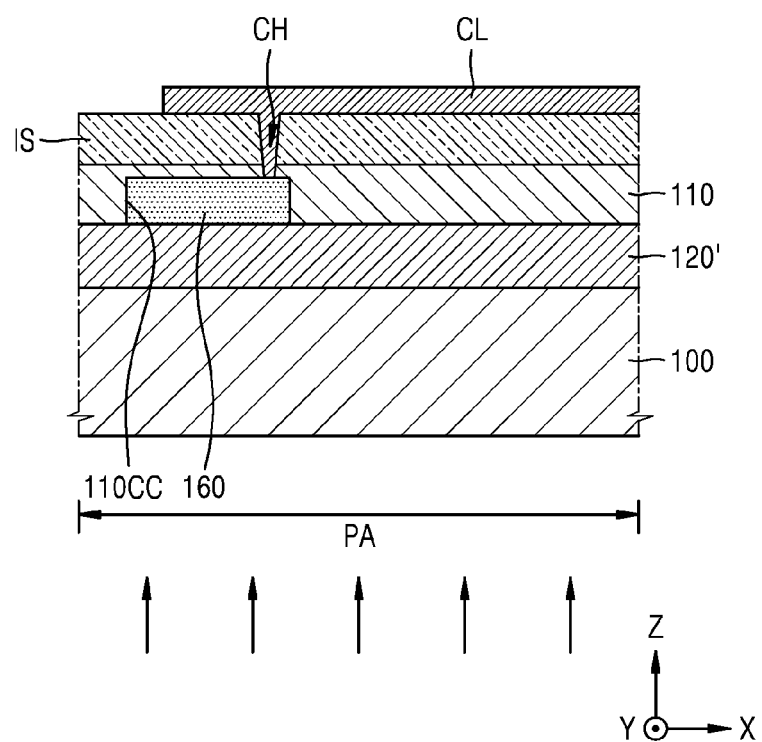
FIGS. 9A, 9B, and 9C are cross-sectional views of the display apparatus of FIG. 8 at various stages of manufacture according to some exemplary embodiments.
Figure 9B:
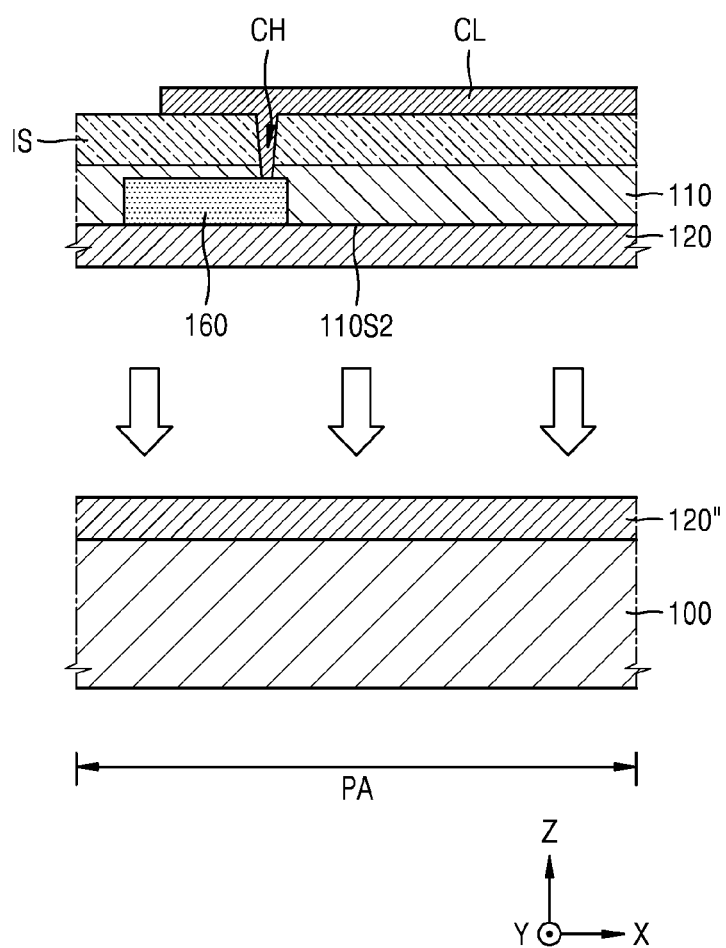
Figure 9C:
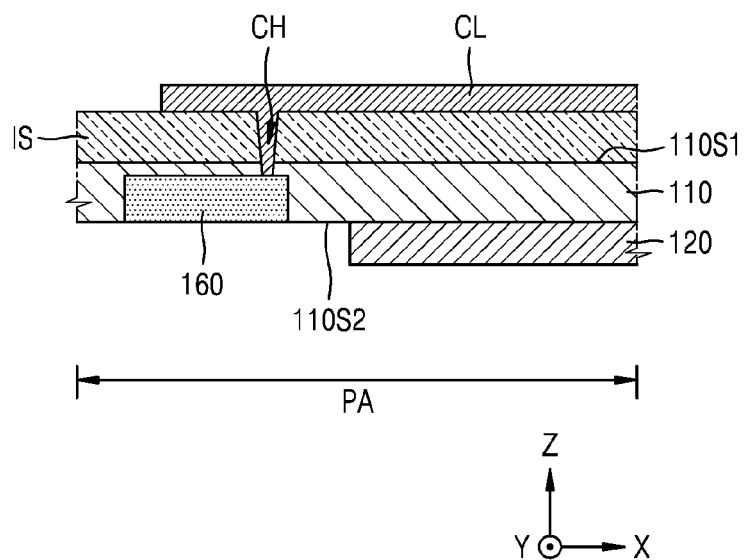

FIG. 8 is a schematic cross-sectional view of a peripheral region of a display apparatus according to some exemplary embodiments. FIGS. 9A, 9B, and 9C are cross-sectional views of the display apparatus of FIG. 8 at various stages of manufacture according to some exemplary embodiments.

Referring to FIG. 8, the display apparatus 4 includes the first flexible substrate 110 including the concave portion 110CC located on the second surface 110S2, and the conductive pattern 160 is disposed in the concave portion 110CC. The second flexible substrate 120 is disposed on the second surface 110S2 of the first flexible substrate 110. The second flexible substrate 120 may include the same material as that used to form the first flexible substrate 110. For example, the first flexible substrate 110 and the second flexible substrate 120 may include PI. The thickness $t_{120}$ of the second flexible substrate 120 may be less than the first thickness $t_1$ of the first flexible substrate 110, and the second flexible substrate 120 may not be arranged on a portion of the first flexible substrate 110 where the conductive pattern 160 is disposed. In other words, the second flexible substrate 120 may be disposed on the second surface 110S2 of the first flexible substrate 110 such that the conductive pattern 160 is exposed.

The support substrate 180 may be disposed on a lower surface of the second flexible substrate 120, and the adhesion layer 181 may be disposed between the second flexible substrate 120 and the support substrate 180. The support substrate 180 may include a material having greater stiffness than the first flexible substrate 110 and the second flexible substrate 120. A thickness of the support substrate 180 may be greater than the thickness $t_{120}$ of the second flexible substrate 120. The support substrate 180 may not be disposed on an area where the conductive pattern 160 is disposed, and may be disposed such that at least a portion of the second flexible substrate 120 is exposed.

Referring to FIG. 9A, in the method of manufacturing the display apparatus 4 of FIG. 8, after the processes sequentially described in association with FIGS. 5A-5H, a laser may be radiated toward the carrier substrate 100 from below the carrier substrate 100. A second flexible substrate 120' not yet removed in FIG. 9A may have a greater thickness than the second flexible substrate 120 of FIG. 5A.

Referring to FIG. 9B, the carrier substrate 100 and a portion of the second flexible substrate 120' may be removed. At this time, only a portion 120" of the second flexible substrate 120' may be removed together with the carrier substrate 100. In other words, the second flexible substrate 120 remains on the second surface 110S2 of the first flexible substrate 110.

Referring to FIG. 9C, an area of the second flexible substrate 120 on the second surface 110S2 of the first flexible substrate 110 that is below the conductive pattern 160 may be removed such that the conductive pattern 160 is exposed. The second flexible substrate 120 may be removed using photolithography or using a mechanical method. Referring back to FIG. 8, the support substrate 180 may be formed on the lower surface of the second flexible substrate 120 using the adhesion layer 181.

Figure 10A:
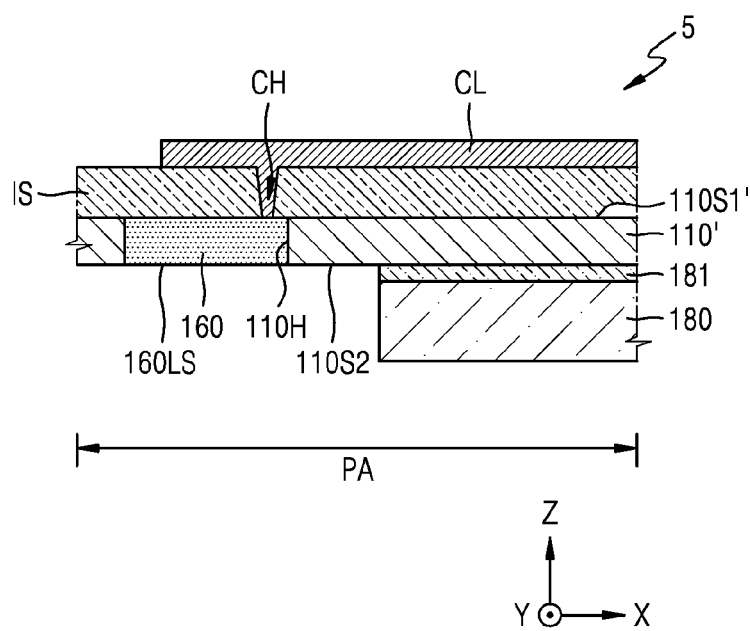
FIGS. 10A and 10B are schematic cross-sectional views of a peripheral region of a display apparatus according to some exemplary embodiments.
Figure 10B:
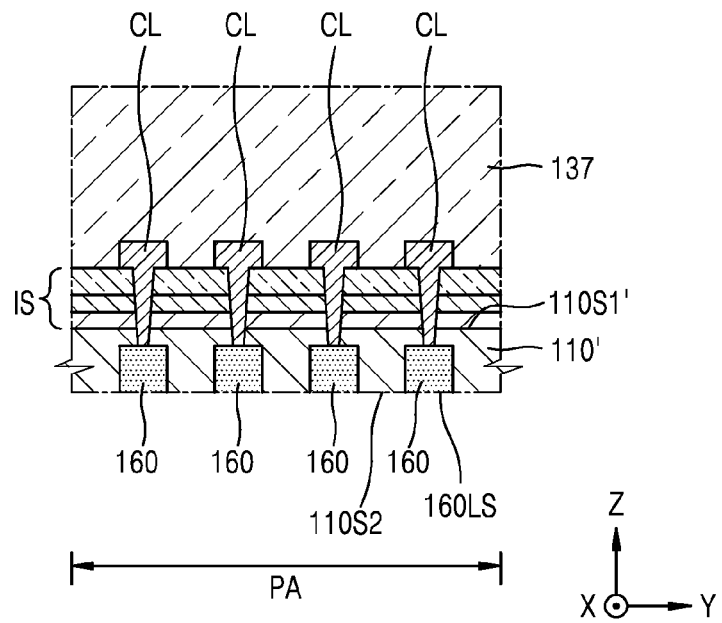
Figure 11A:
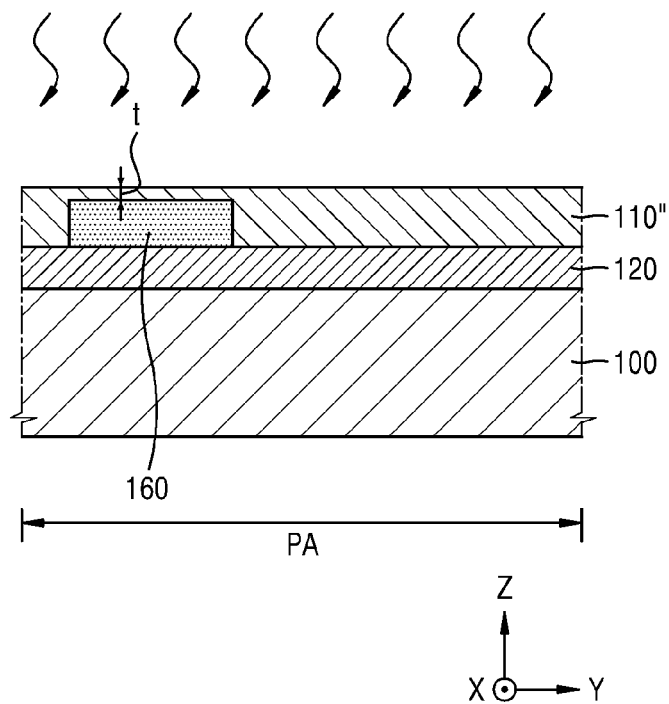
FIGS. 11A and 11B are cross-sectional views of the display apparatus of FIG. at various stages of manufacture according to some exemplary embodiments.
Figure 11B:
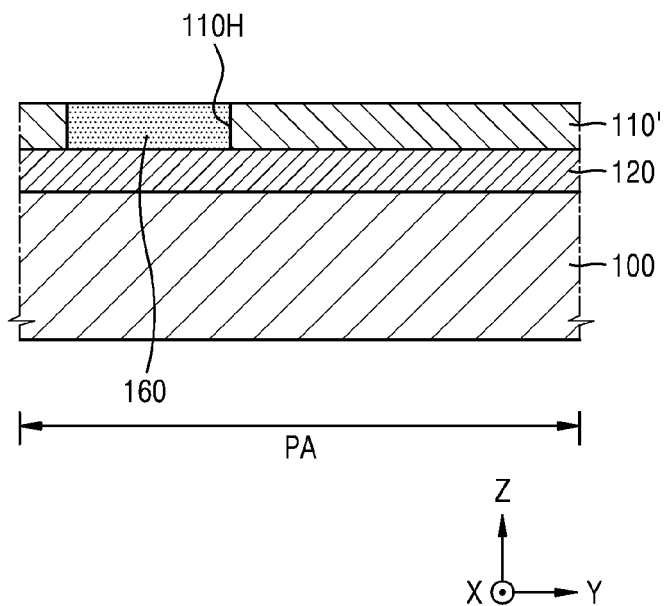

FIGS. 10A and 10B are schematic cross-sectional views of a peripheral region of a display apparatus according to some exemplary embodiments. FIGS. 11A and 11B are cross-sectional views of the display apparatus of FIG. 10A at various stages of manufacture according to some exemplary embodiments Referring to FIG. 10A, the display apparatus 5 includes a first flexible substrate 110' having a first surface 110S1' and a second surface 110S2 opposite to the first surface 110S1', the second surface 110S2 including a hole 110H. The driving circuit unit DC of FIG. 3 may be disposed on the first surface 110S1' of the first flexible substrate 110' and may include, for instance, the at least one transistor T1 of FIG. 3. The display apparatus 5 may further include a conductive pattern 160 disposed in the hole 110H included in the second surface 110S2 and partially exposed, a conductive line CL electrically connecting the conductive pattern 160 to the driving circuit unit DC, the light-emitting device OLED of FIG. 3 driven by the driving circuit unit DC, and a support substrate 180 disposed on the second surface 110S2 of the first flexible substrate 110' so as not to overlap with the conductive pattern 160.

The other structures of the display apparatus 5 of FIG. 10A are substantially the same as those of the display apparatus 1 of FIG. 3. In other words, the display apparatus 5 of FIG. 10A is different from the display apparatus 1 of FIG. 3 only in that the first flexible substrate 110' includes the hole 110H instead of the concave portion 110CC, and the conductive pattern 160 is disposed in the hole 110H.

It is recognized that because the conductive pattern 160 includes metal and the first flexible substrate 110' includes an organic material, such as PI, bubbles may be generated between the conductive pattern 160 and the first flexible substrate 110'. In other words, due to weak bondability between the conductive pattern 160 and the first flexible substrate 110', the conductive pattern 160 may be easily separated from the first flexible substrate 110'. However, when the first flexible substrate 110' is not disposed on an upper surface of the conductive pattern 160, but the insulation structure IS including the buffer layer 131 of FIG. 3 including an inorganic material is disposed directly thereon, the conductive pattern 160 may not be separated from the display panel DP of FIG. 3 due to strong bondability between the conductive pattern 160 and the insulation structure IS.

Referring to FIG. 10B, the first flexible substrate 110' may include a plurality of holes 110H in which the plurality of conductive patterns 160 are respectively disposed, and the upper surface of the conductive patterns 160 may directly contact the insulation structure IS. In this manner, contact holes CH for connecting the conductive lines CL disposed on the insulation structure IS to the conductive patterns 160 may be easily formed. As such, the contact holes CH may be formed in the insulation structure IS using a single photolithography process, and the conductive lines CL may be formed on the insulation structure IS. Accordingly, the conductive patterns 160 and the conductive lines CL may be connected to each other.

Referring to FIG. 11A, the second flexible substrate 120 and the conductive pattern 160 may be formed on the carrier substrate 100, and then an organic material 110" used to form the first flexible substrate 110' may be deposited on the second flexible substrate 120. The organic material 110" may cover the upper surface and the lateral surfaces of the conductive pattern 160, and a portion of the organic material 110" on the conductive pattern 160 may have a thickness t that is relatively small. For example, the thickness t may be about 150 nm or less. After the organic material 110" is formed, the organic material 110" may undergo plasma processing. The organic material 110" may have viscosity of about 20000 cp or less such that the portion of the organic material 110" on the conductive pattern 160 is formed to have a small thickness t.

Referring to FIG. 11B, after plasma processing is performed on the organic material 110", ashing is performed to remove a portion of the organic material 110" deposited on the conductive pattern 160, thereby forming the first flexible substrate 110'. The first flexible substrate 110' may include the hole 110H corresponding to the portion in which the conductive pattern 160 is disposed.

Figure 12A:
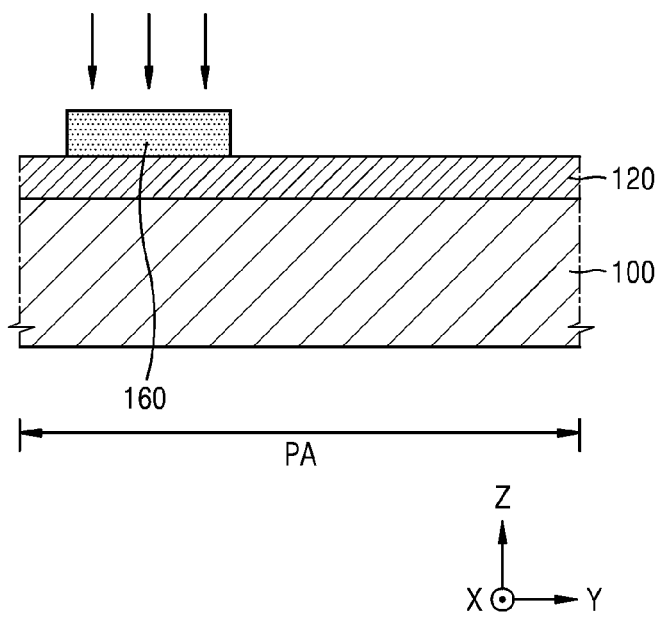
FIGS. 12A, 12B, and 12C are cross-sectional views of the display apparatus of FIG. 10A at various stages of manufacture according to some exemplary embodiments.
Figure 12B:
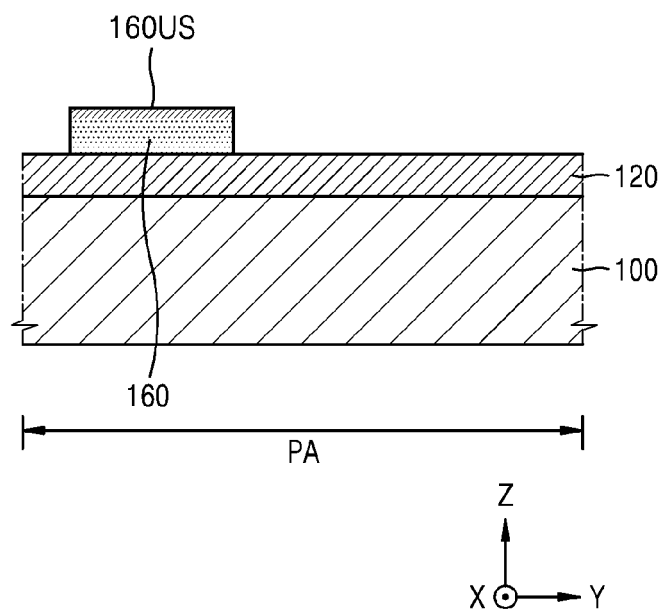
Figure 12C:
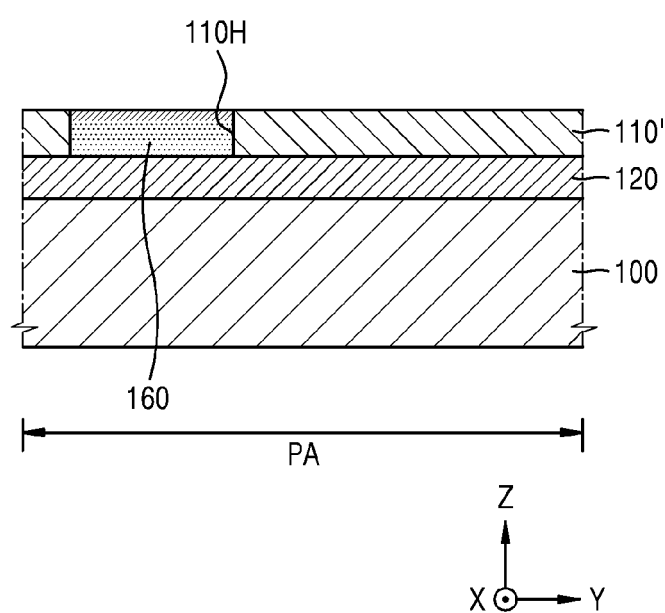

FIGS. 12A, 12B, and 12C are cross-sectional views of the display apparatus of FIG. 10A at various stages of manufacture according to some exemplary embodiments.

Referring to FIGS. 12A and 12B, the second flexible substrate 120 and the conductive pattern 160 may be formed on the carrier substrate 100, and then hydrophobic processing may be performed on the conductive pattern 160. Using the hydrophobic processing, at least the upper surface 160US of the conductive pattern 160 may be configured to obtain a hydrophobic property. In other words, the upper surface 160US of the conductive pattern 160 is made to be hydrophobic.

Referring to FIG. 12C, the first flexible substrate 110' may be formed on the second flexible substrate 120. The first flexible substrate 110' may be formed of a material having low viscosity, and may not be formed on an upper surface 160US of the conductive pattern 160 that has undergone the hydrophobic processing. In other words, the first flexible substrate 110' may include the hole 110H corresponding to an area in which the conductive pattern 160 is disposed.

Referring back to FIG. 10A, the insulation structure IS may be formed on the first flexible substrate 110', the contact hole CH may be formed in the insulation structure IS. The conductive line CL may then be formed on the insulation structure IS. The carrier substrate 100 and the second flexible substrate 120 may be removed. Then, the support substrate 180 may be formed on the second surface 110S2 of the first flexible substrate 110.

Figure 13:
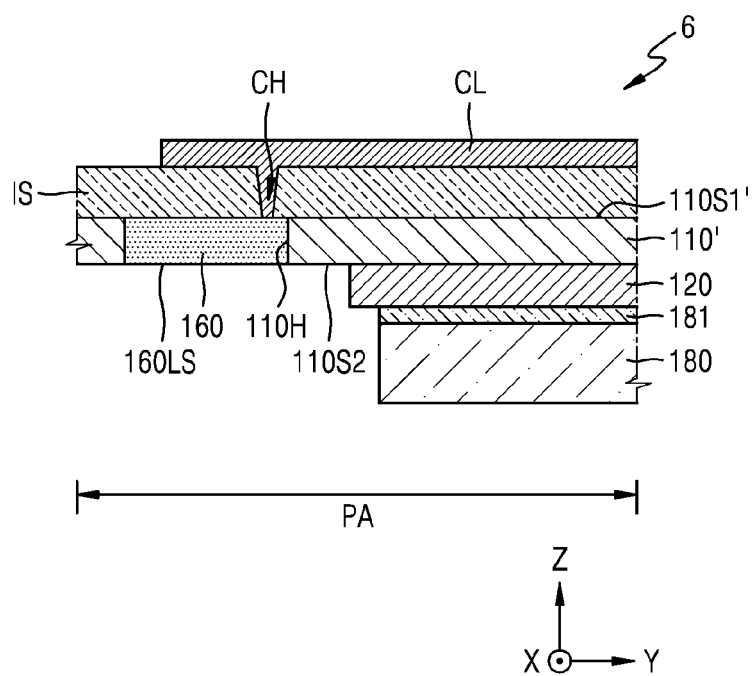
FIG. 13 is a schematic cross-sectional view of a peripheral region of a display apparatus according to some exemplary embodiments.

FIG. 13 is a schematic cross-sectional view of a peripheral region of a display apparatus according to some exemplary embodiments.

Referring to FIG. 13, the display apparatus 6 includes the first flexible substrate 110' including the hole 110H located on the second surface 110S2, and the conductive pattern 160 is disposed in the hole 110H. The second flexible substrate 120 is disposed on the second surface 110S2 of the first flexible substrate 110'. The second flexible substrate 120 may include the same material as that used to form the first flexible substrate 110'. For example, the first flexible substrate 110 and the second flexible substrate 120 may include PI. The second flexible substrate 120 may not be disposed on the area where the conductive pattern 160 is disposed. In other words, the second flexible substrate 120 may be disposed on the second surface 110S2 of the first flexible substrate 110' such that the conductive pattern 160 is exposed.

The support substrate 180 may be disposed on a lower surface of the second flexible substrate 120, and the adhesion layer 181 may be disposed between the second flexible substrate 120 and the support substrate 180. The support substrate 180 may include a material having greater stiffness than the first flexible substrate 110 and the second flexible substrate 120. The support substrate 180 may not be disposed on a portion where the conductive pattern 160 is disposed, and may be disposed such that at least a portion of the second flexible substrate 120 is exposed.

With reference to FIG. 3, the flexible PCB 173 and the like may be connected to the exposed conductive pattern 160 of FIG. 13, and, thus, may electrically connect the conductive pattern 160 to the main circuit unit 174 for controlling the display apparatus 6.

According to various exemplary embodiments, a display apparatus may include a conductive pattern 160 exposed at the back surface of a display panel DP to connect the flexible PCB 173 and the like to the conductive pattern 160. In this manner, the area of the peripheral region PA of the display apparatus may be minimized or at least reduced. Further, according to the various methods of manufacturing a display apparatus, the conductive pattern 160 may not be easily separated from the display panel DP, and the contact hole CH for connecting the conductive line CL to the conductive pattern 160 may be easily formed.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display apparatus comprising:
a conductive pattern comprising a top surface, a bottom surface opposite to the top surface, and a lateral surface connecting the top surface to the bottom surface;
a first adhesion layer on the conductive pattern;
a first substrate on the first adhesion layer;
a driving circuit over the first substrate, the driving circuit comprising at least one transistor;
a light-emitting device configured to be driven by the driving circuit;
a contact hole formed in the first adhesion layer and the first substrate to partially expose the top surface of the conductive pattern;
a conductive line over the first substrate, the conductive line electrically connecting the driving circuit to the conductive pattern through the contact hole;
a second substrate under the first adhesion layer; and
a second adhesion layer between the second substrate and the first adhesion layer,
wherein, in a plan view, at least a portion of the conductive pattern does not overlap the second adhesion layer.

2. The display apparatus of claim 1, wherein, in a plan view, the at least a portion of the conductive pattern does not overlap the second substrate.

3. The display apparatus of claim 1, wherein a portion of the bottom surface of the conductive pattern is exposed by the second substrate in an area where the first adhesion layer and the second adhesion layer do not overlap.

4. The display apparatus of claim 3, wherein the second adhesion layer exposes the portion of the bottom surface of the conductive pattern.

5. The display apparatus of claim 1, wherein the first adhesion layer covers the top surface and the lateral surface of the conductive pattern.

6. The display apparatus of claim 1, wherein the first adhesion layer extends from the lateral surface of the conductive pattern and directly contacts a top surface of the second adhesion layer.

7. The display apparatus of claim 1, wherein the first substrate comprises polyimide.

8. The display apparatus of claim 1, wherein the second substrate comprises polyimide.

9. The display apparatus of claim 1, wherein the first adhesion layer comprises silicon.

10. The display apparatus of claim 1, wherein, in a plan view, at least a portion of the conductive line overlaps the conductive pattern.

11. The display apparatus of claim 1, further comprising:
a connector under the conductive pattern; and
a conductive adhesive between the conductive pattern and the connector.

12. The display apparatus of claim 11, further comprising a flexible printed circuit board connected to the connector, wherein a portion of the flexible printed circuit board overlaps the second substrate.

* * * * *